United States Patent
Baik et al.

(10) Patent No.: US 10,490,768 B2
(45) Date of Patent: Nov. 26, 2019

(54) ORGANIC LIGHT EMITTING DISPLAY DEVICE HAVING AT LEAST TWO PIXEL AREAS WITH A PLANARIZATION FILM THEREBETWEEN, HEAD MOUNTED DISPLAY INCLUDING THE SAME, AND METHOD FOR MANUFACTURING THE SAME

(71) Applicant: LG Display Co., Ltd., Seoul (KR)

(72) Inventors: Seung Min Baik, Gimpo-so (KR); Jong Sung Kim, Paju-si (KR); Ho-Jin Kim, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/797,572

(22) Filed: Oct. 30, 2017

(65) Prior Publication Data
US 2018/0123081 A1 May 3, 2018

(30) Foreign Application Priority Data
Oct. 31, 2016 (KR) .................. 10-2016-0143208

(51) Int. Cl.
*H01L 29/08* (2006.01)
*H01L 51/52* (2006.01)
*H01L 27/32* (2006.01)
*H01L 51/56* (2006.01)
*G02B 27/01* (2006.01)

(52) U.S. Cl.
CPC ...... *H01L 51/5209* (2013.01); *H01L 27/3246* (2013.01); *H01L 51/5215* (2013.01); *H01L 51/5275* (2013.01); *H01L 51/56* (2013.01); *G02B 27/0172* (2013.01); *H01L 27/322* (2013.01); *H01L 51/5253* (2013.01); *H01L 2227/323* (2013.01)

(58) Field of Classification Search
USPC ........................................................ 257/40
See application file for complete search history.

(56) References Cited

U.S. PATENT DOCUMENTS

| 9,443,461 | B2 * | 9/2016 | Kimura | ............... G09G 3/3258 |
| 9,871,090 | B2 * | 1/2018 | Lee | ................... H01L 27/3248 |
| 10,050,223 | B2 * | 8/2018 | Im | ......................... H01L 51/56 |

(Continued)

FOREIGN PATENT DOCUMENTS

| CN | 101847601 A | 9/2010 |
| CN | 103140951 A | 6/2013 |

(Continued)

*Primary Examiner* — Caleb E Henry
(74) *Attorney, Agent, or Firm* — Seed IP Law Group LLP

(57) ABSTRACT

Disclosed is an organic light emitting display device which is capable of preventing an anode electrode from being structurally disconnected with a cathode electrode or a charge generation layer of an organic light emitting layer, and a head mounted display including the same, and a method for manufacturing the same, wherein the organic light emitting display device may include an insulating film, a first electrode and another first electrode on the insulating film, a planarization film filling a space between the first electrode and the another first electrode, an organic light emitting layer on the first electrode and the another first electrode and the planarization film, and a second electrode on the organic light emitting layer.

15 Claims, 17 Drawing Sheets

(56) References Cited

U.S. PATENT DOCUMENTS

| | | |
|---|---|---|
| 2010/0248403 A1 | 9/2010 | Hatano et al. |
| 2011/0122500 A1 | 5/2011 | Kobayashi |
| 2012/0205678 A1 | 8/2012 | Ikeda et al. |
| 2012/0228603 A1* | 9/2012 | Nakamura ............ H01L 27/322 257/40 |
| 2012/0292621 A1 | 11/2012 | Kim et al. |
| 2013/0240854 A1 | 9/2013 | Sugano et al. |
| 2015/0138224 A1 | 5/2015 | Kim et al. |
| 2015/0236297 A1 | 8/2015 | Hong et al. |
| 2015/0349029 A1 | 12/2015 | Choi et al. |
| 2016/0293888 A1* | 10/2016 | Shim ................... H01L 27/3246 |
| 2017/0062755 A1* | 3/2017 | Im .......................... H01L 51/56 |
| 2017/0110530 A1* | 4/2017 | Lee ..................... H01L 27/3248 |
| 2017/0146846 A1* | 5/2017 | Funakoshi ........ G02F 1/133512 |

FOREIGN PATENT DOCUMENTS

| | | |
|---|---|---|
| CN | 105849622 A | 8/2016 |
| TW | 201533946 A | 9/2015 |
| WO | 2014/155691 A1 | 10/2014 |

\* cited by examiner

ORGANIC LIGHT EMITTING DISPLAY DEVICE HAVING AT LEAST TWO PIXEL AREAS WITH A PLANARIZATION FILM THEREBETWEEN, HEAD MOUNTED DISPLAY INCLUDING THE SAME, AND METHOD FOR MANUFACTURING THE SAME

CROSS REFERENCE TO RELATED APPLICATIONS

This application claims priority from and the benefit of the Korean Patent Application No. 10-2016-0143208 filed on Oct. 31, 2016, which is hereby incorporated by reference in its entirety.

BACKGROUND

Technical Field

Embodiments of the present disclosure relate to an organic light emitting display device, a head mounted display including the same, and a method for manufacturing the same.

Description of the Related Art

With the advancement of an information-oriented society, various requirements for the display device of displaying an image are increasing. Thus, various display devices of a liquid crystal display (LCD) devices, a plasma display panel (PDP) devices, and an organic light emitting display (OLED) device have been utilized.

The OLED device is a self light emitting display device. In comparison to the LCD device, the OLED device has wider viewing angle and greater contrast ratio. Also, the OLED device may be fabricated at a lightweight and slim size as it does not need a separate light source unlike the LCD device, and furthermore the OLED device is favorable in view of power consumption. In addition, the OLED device may be driven by a low DC voltage, and a response speed of the OLED device is rapid. Especially, the OLED device may have the advantage of low manufacturing cost.

The OLED device may include anode electrodes, a bank for dividing the anode electrodes, a hole transporting layer, an organic light emitting layer, and an electron transporting layer on the anode electrodes, and a cathode electrode on the electron transporting layer. In this case, when a high potential voltage is applied to the anode electrode, and a low potential voltage is applied to the cathode electrode, holes and electrons are respectively moved to the organic light emitting layer via the hole transporting layer and the electron transporting layer, and are then combined to one another in the organic light emitting layer, to thereby emit light.

BRIEF SUMMARY

Accordingly, embodiments of the present disclosure are directed to an organic light emitting display device that substantially obviates one or more problems due to limitations and disadvantages of the related art, and a head mounted display including the same, and a method for manufacturing the same.

An aspect of embodiments of the present disclosure is directed to providing an organic light emitting display device which is capable of preventing an anode electrode from being structurally disconnected with a cathode electrode or a charge generation layer of an organic light emitting layer, and a head mounted display including the same, and a method for manufacturing the same.

Additional advantages and features of embodiments of the disclosure will be set forth in part in the description which follows and in part will become apparent to those having ordinary skill in the art upon examination of the following or may be learned from practicing embodiments of the disclosure. The objectives and other advantages of embodiments of the disclosure may be realized and attained by the structure particularly pointed out in the written description and claims hereof as well as the appended drawings.

To achieve these and other advantages and in accordance with the purpose of embodiments of the disclosure, as embodied and broadly described herein, there is provided an organic light emitting display (OLED) device that may include an insulating film; a first electrode and another first electrode on the insulating film; a planarization film filling a space between the first electrode and the another first electrode; an organic light emitting layer on the first electrode and the another first electrode and the planarization film; and a second electrode on the organic light emitting layer.

In another aspect of an embodiment of the present disclosure, there is provided a head mounted display that may include an organic light emitting display (OLED) device; a display receiving case for receiving the OLED device therein; and a lens disposed at one side of the display receiving case, and provided with an image of the OLED device; wherein the OLED device comprises an insulating film; a first electrode and another first electrode on the insulating film; a planarization film filling a space between the first electrode and the another first electrode; an organic light emitting layer on the first electrode and the another first electrode and the planarization film; and a second electrode on the organic light emitting layer.

In another aspect of an embodiment of the present disclosure, there is provided a method for manufacturing an organic light emitting display (OLED) device that may include forming first electrode and another first electrode on an insulating film; forming a planarization film filling a space between the first electrode and the another first electrode; forming an organic light emitting layer on the first electrode and the another first electrode and the planarization film; and forming a second electrode on the organic light emitting layer.

It is to be understood that both the foregoing general description and the following detailed description of embodiments of the present disclosure are examples and explanatory and are intended to provide further explanation of the invention as claimed.

BRIEF DESCRIPTION OF THE SEVERAL VIEWS OF THE DRAWINGS

The accompanying drawings, which are included to provide a further understanding of embodiments of the disclosure and are incorporated in and constitute a part of this application, illustrate embodiment(s) of the disclosure and together with the description serve to explain the principle of embodiments of the disclosure. In the drawings.

DETAILED DESCRIPTION

Figure 1:
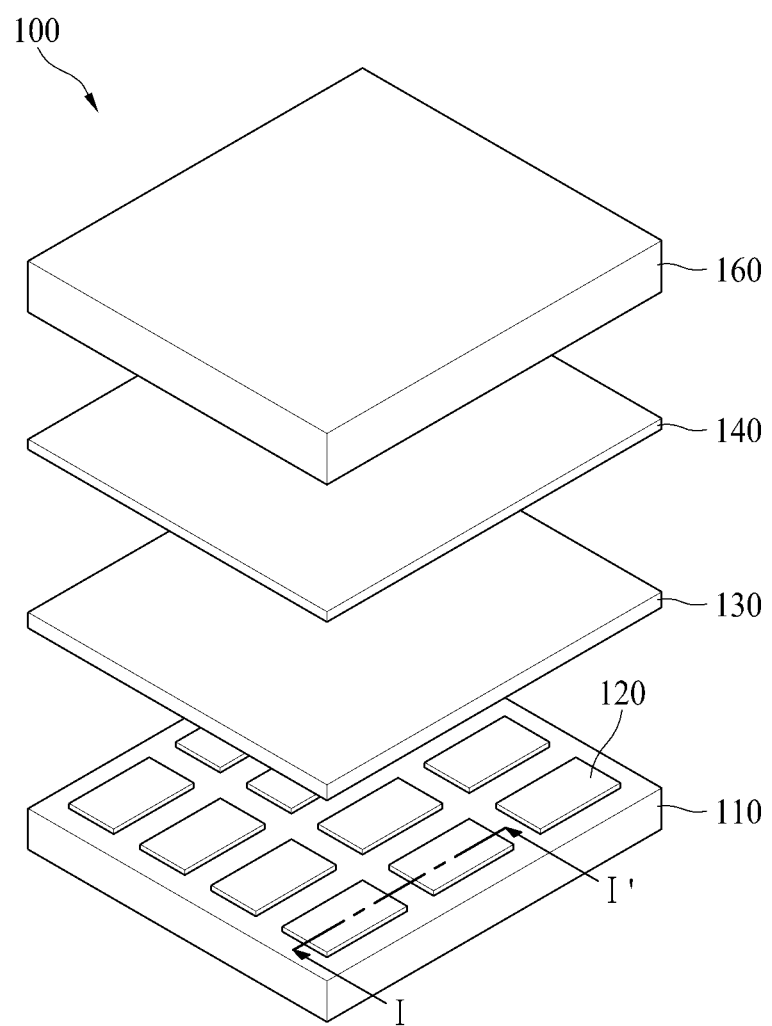
FIG. 1 is an exploded perspective view illustrating an OLED device according to one embodiment of the present disclosure.

Reference will now be made in detail to the example embodiments of the present disclosure, examples of which are illustrated in the accompanying drawings. Wherever possible, the same reference numbers will be used throughout the drawings to refer to the same or like parts. Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided to facilitate a thorough and complete understanding of the disclosure, and will fully convey the scope of the present disclosure to those skilled in the art. Further, the present invention is only defined by scopes of claims.

A shape, a size, a ratio, an angle, and a number disclosed and/or shown in the drawings for describing embodiments of the present disclosure are merely an example(s), and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

For example, it is appreciated that the term "hole" in the description may include the scenario of a trench.

In a case where 'comprise', 'have', and 'include' described in the present specification are used, another part may be added unless 'only~' is used. The terms of a singular form may include plural forms unless referred to the contrary.

In construing an element, the element is construed as including an error region although there is no explicit description.

In describing a position relationship, for example, when the positional order is described as 'on~', 'above~', 'below~' and 'next~', a case which is not contact may be included unless 'just' or 'direct' is used.

In describing a time relationship, for example, when the temporal order is described as 'after~', 'subsequent~', 'next~', and 'before~' a case which is not continuous may be included unless 'just' or 'direct' is used.

It will be understood that, although the terms "first", "second", etc., may be used herein to describe various elements, these elements should not be limited by these terms. These terms are only used to distinguish one element from another. For example, a first element could be termed a second element, and, similarly, a second element could be termed a first element, without departing from the scope of the present disclosure.

Also, "X-axis direction", "Y-axis direction", and "Z-axis direction" are not limited to a perpendicular geometric configuration. That is, "X-axis direction", "Y-axis direction", and "Z-axis direction" may include an applicable wide range of a functional configuration.

Also, it should be understood that the term "at least one" includes all combinations related with any one item. For example, "at least one among a first element, a second element and a third element" may include all combinations of two or more elements selected from the first, second and third elements as well as each element of the first, second and third elements. Also, if it is mentioned that a first element is positioned "on or above" a second element, it should be understood that the first and second elements may be brought into contact with each other, or a third element may be interposed between the first and second elements.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, an organic light emitting display (OLED) device according to embodiments of the present disclosure, a head mounted display including the same, and a method for manufacturing the same will be described in detail with reference to the accompanying drawings.

A head mounted display (hereinafter, referred to as 'HMD') is a glass-type monitor device for virtual reality (VR) or augmented reality, which is worn on the head or as part of helmet or glasses of a user, and makes a focus in front of the user's eyes. A small-sized OLED device with high resolution is applied to the HMD. The small-sized OLED device with high resolution may be an organic light emitting diode on silicon (OLEDoS) manufactured by a wafer-based semiconductor manufacturing process. In this case, an anode electrode is provided on an insulating film for covering a transistor on a wafer, and an organic light emitting layer is not uniform at the edge of anode electrode due to a difference in height between the anode electrode and the insulating film, whereby the anode electrode may be structurally disconnected with a cathode electrode or a charge generation layer of the organic light emitting layer FIG. 1 is an exploded perspective view illustrating an OLED device according to one embodiment of the present disclosure. In FIG. 1, the OLED device 100 according to one embodiment of the present disclosure is an organic light emitting diode on silicon (OLEDoS) which provides an organic light emitting device on a wafer substrate manufactured by a semiconductor process, but not limited to this type.

Referring to FIG. 1, the OLED device 100 according to one embodiment of the present disclosure may include a wafer substrate 110, first electrodes 120, an organic light emitting layer 130, a second electrode 140, and an encapsulation film 160.

The wafer substrate 110 may be a silicon wafer substrate manufactured by a semiconductor process. The wafer substrate 110 may include gate lines, data lines, and transistors. The gate lines are arranged in such a manner that they are perpendicular to the data lines. The gate lines are connected with a gate driver, and are supplied with gate signals. The data lines are connected with a data driver, and are supplied with data voltages.

Figure 2:
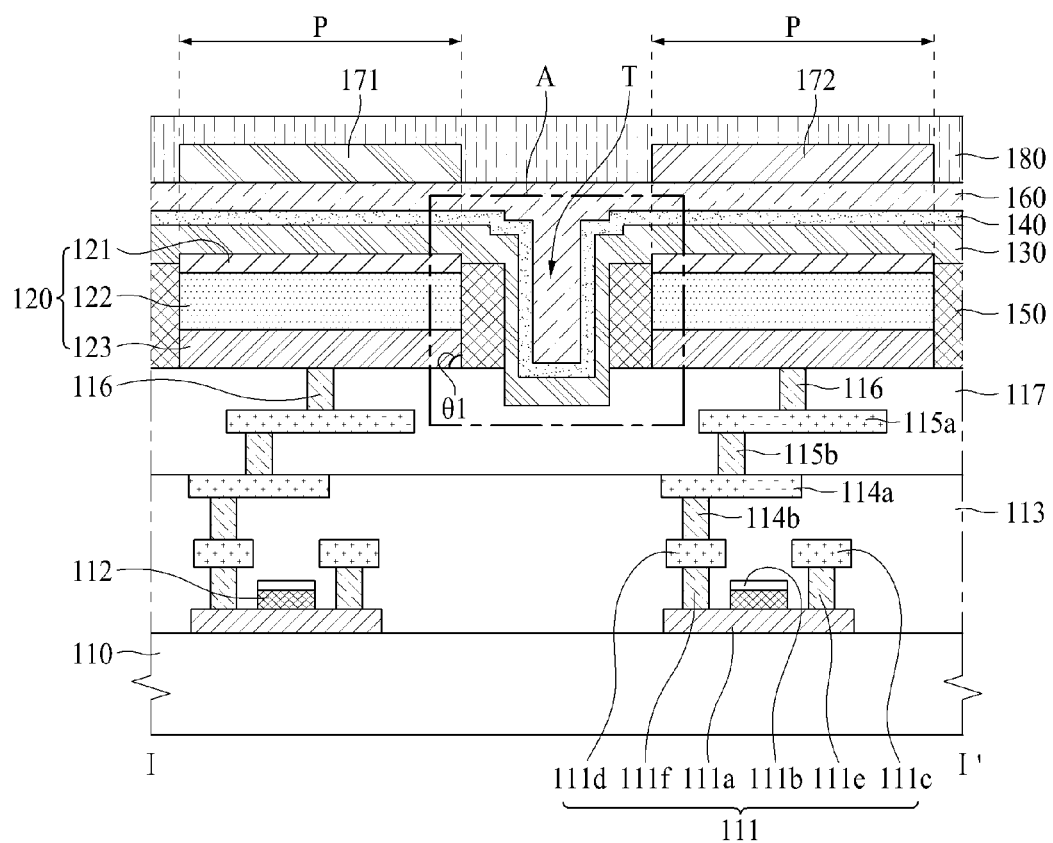
FIG. 2 is a cross-sectional view of one example along I-I' of FIG. 1.

An area where the first electrode 120, the organic light emitting layer 130, and the second electrode 140 are sequentially deposited thereon may be defined with a pixel for emitting light. The first electrodes 120 are provided at fixed intervals on the wafer substrate 110, whereby the pixel may be divided by the first electrode(s) 120. There may be the 'N' transistors ('N' is a positive integer) disposed in the pixel. If the gate signal is supplied from the gate line to the 'N' transistors, a predetermined voltage is supplied to the first electrode 120 in accordance with the data voltage of the data line. Each of the first electrodes 120 may include a transparent electrode 121, a reflective electrode 122, and a buffer electrode 123 as shown in FIG. 2.

The organic light emitting layer 130 may cover the wafer substrate 110 and the first electrodes 120. The organic light emitting layer 130 may be a common layer provided on the pixels in common.

The second electrode 140 may cover the organic light emitting layer 130. The second electrode 140 may be a common layer provided on the pixels in common.

The encapsulation film 160 may cover the second electrode 140. The encapsulation film 160 may prevent permeation of oxygen and/or moisture into the organic light emitting layer 130 and the second electrode 140.

Hereinafter, the OLED device according to the embodiments of the present disclosure will be described in detail with reference to FIGS. 2, 6, 8, and 10.

FIG. 2 is a cross sectional view of one example along I-I' of FIG. 1.

Referring to FIG. 2, the transistors 111 are provided on the wafer substrate 110. Each of the transistors 111 may include an active layer 111a, a gate electrode 111b, a source electrode 111c, and a drain electrode 111d. In FIG. 2, each of the transistors 111 is provided in a top gate type where the gate electrode 111b is positioned above the active layer 111a, but not limited to this type. For example, each of the transistors 111 may be provided in a bottom gate type where the gate electrode 111b is positioned below the active layer 111a, or a double gate type where the gate electrode 111b is positioned both above and below the active layer 111a.

The active layer 111a is provided on the wafer substrate 110. The active layer 111a may be formed of a silicon-based semiconductor material or an oxide-based semiconductor material. Then, a gate insulating film 112 is provided on the active layer 111a. The gate insulating film 112 may be formed of an inorganic film, for example, a silicon oxide film (SiOx), a silicon nitride film (SiNx), or a multi-layered film including silicon oxide (SiOx) and silicon nitride (SiNx). The gate electrode 111b may be provided on the gate insulating film 112.

The source electrode 111c is connected with the active layer 111a via a first hole/via 111e, and the drain electrode 111d is connected with the active layer 111a via a second hole/via 111f. The active layer 111a, the gate electrode 111b, the source electrode 111c, and the drain electrode 111d are insulated from one another by a first insulating film 113. The first insulating film 113 may be formed of an inorganic film, for example, a silicon oxide film (SiOx), a silicon nitride film (SiNx), or a multi-layered film including silicon oxide (SiOx) and silicon nitride (SiNx).

Then, M3 metal layer 114a and M4 metal layer 115a are disposed on the first insulating film 113. The M3 metal layer 114a is connected with the drain electrode 111d via a third hole/via 114b, and the M4 metal layer 115a is connected with the M3 metal layer 114a via a fourth hole/via 115b. The M3 metal layer 114a and the M4 metal layer 115a are insulated from each other by a second insulating film 117. The second insulating film 117 may be formed of an inorganic insulating film, for example, a silicon oxide film (SiOx), a silicon nitride film (SiNx), or a multi-layered film including silicon oxide (SiOx) and silicon nitride (SiNx). Herein, it is possible to omit the M3 metal 114a, the M4 metal layer 115a, and the second insulating film 117, which is included in the disclosure. In the case that the M3 metal 114a, the M4 metal layer 115a, and the second insulating film 117 are omitted, the description herein about the structural relationship between the second insulating film 117 and structures there on may apply to the first insulating film 113 and the structures thereon instead.

The first electrodes 120 are disposed on the second insulating film 117. The first electrodes 120 are respectively connected with the M4 metal layer 115a via a fifth hole/via 116.

Each of the first electrodes 120 may include a transparent electrode 121, a reflective electrode 122, and a buffer electrode 123 as shown in FIG. 2. The transparent electrode 121 may be formed of a transparent metal material (transparent conductive material, TCO) capable of transmitting light therethrough, for example, Indium Tin Oxide (ITO) or Indium Zinc Oxide (IZO).

The OLED device according to the embodiment of the present disclosure illustrates an example of a top emission type where light emitted from the organic light emitting layer 130 advances upwardly. In this top emission type, a reflective electrode 122 may be provided below each of the transparent electrodes 121 so as to reflect light emitted from the organic light emitting layer 130. The reflective electrode 122 may be formed of a metal material with high reflectance, for example, argentums (Ag).

A buffer electrode 123 may be provided below each of the reflective electrodes 122. The buffer electrode 123 may be formed in a double-layered structure of, for example, titanium (Ti) and nitride titanium (TiN). Herein, it is possible to omit the buffer electrode 123.

The transparent electrodes 121, the reflective electrodes 122, and the buffer electrodes 123 may be provided in a vertical structure. In case of the vertical structure, an inner angle (θ1) between the second insulating film 117 (or first insulating film 113 in the case the M3 metal 114a, the M4 metal layer 115a, and the second insulating film 117 are omitted) and a lateral surface of each of the transparent electrodes 121, the reflective electrodes 122, and the buffer electrodes 123 is 90° or substantially 90°.

In order to planarize a difference in height, which is caused by the transparent electrodes 121, the reflective electrodes 122, and the buffer electrodes 123, a planarization film 150 may be disposed between the first electrodes 120.

Also, a sixth hole (T) may be prepared in the planarization film 150. In FIG. 2, the sixth hole (T) penetrates through the planarization film 150 so that a part of the second insulating film 117 is hollow, but not limited to this structure. For example, other scenarios, like a part of the planarization film 150 may be hollow by the sixth hole (T), the sixth hole (T) may penetrate through both the planarization film 150 and the second insulating film 117, a part of the first insulating film 113 may be hollow by the sixth hole (T), or the sixth hole (T) may penetrate through the planarization film 150, the second insulating film 117, and the first insulating film 113, are also possible and included in the disclosure.

The organic light emitting layer 130 is provided on the transparent electrodes 121 and the planarization film 150. The organic light emitting layer 130 may include a hole transporting layer, a light emitting layer, and an electron transporting layer. In this case, if a voltage is applied to the transparent electrode 121 and the second electrode 140, holes and electrons are respectively moved to the light emitting layer via the hole transporting layer and the electron transporting layer, and are then combined to one another in the light emitting layer, to thereby emit light.

The organic light emitting layer 130 may be a white light emitting layer for emitting white light. In this case, the organic light emitting layer 130 may be a common layer provided on the pixels (P) in common.

If the organic light emitting layer 130 is the white light emitting layer, it may have a tandem structure of two stacks or more than two stacks. Each stack may include a hole transporting layer, at least one light emitting layer, and an electron transporting layer.

Between each of the stacks, there may be a charge generation layer. The charge generation layer may include an n-type charge generation layer positioned adjacent to the lower stack, and a p-type charge generation layer provided on the n-type charge generation layer and positioned adjacent to the upper stack. The n-type charge generation layer injects the electron into the lower stack, and the p-type charge generation layer injects the hole into the upper stack. The n-type charge generation layer may be formed of an organic layer doped with alkali metal such as lithium (Li), natrium (Na), kalium (K) or cesium (Cs), or alkali earth metal such as magnesium (Mg), strontium (Sr), barium (Ba) or radium (Ra). The P-type charge generation layer may be formed of an organic layer doped with dopant with a hole transporting capacity.

The organic light emitting layer 130 may be formed by a deposition process or a solution process. In case of the deposition process, the organic light emitting layer 130 may be manufactured by an evaporation process, however, it has bad step coverage. If the planarization film 150 is not disposed between each of the first electrodes 120, the organic light emitting layer 130 is relatively thin in a stepped-difference area (an area with different heights) between the second insulating film 117 (or first insulating film 113 in the case the M3 metal 114a, the M4 metal layer 115a, and the second insulating film 117 are omitted) and the first electrode 120. Thus, in the stepped-difference area between the second insulating film 117 and the first electrode 120, the first electrode 120 may be structurally disconnected (e.g., spaced apart) with one or more of the second electrode 140 or the charge generation layer of the organic light emitting layer 130 such that transportation of holes may be affected. The step coverage indicates that the film prepared by the deposition process is not structurally disconnected even in the step-difference area. It should be appreciated that the first electrodes 120 and the second electrode 140 are not supposed to be electrically connected. The term "structurally disconnected" or "structural disconnection" in the description herein refer to a scenario that the first electrode 120 is structurally spaced apart from the second electrode 140 or the charge generation layer of the organic light emitting layer 130 such that holes from the first electrode 120 and/or electrons from the second electrode 140 cannot be properly transported to the charge generation layer of the organic light emitting layer 130 to combine with one another to generate light.

Figure 3A:
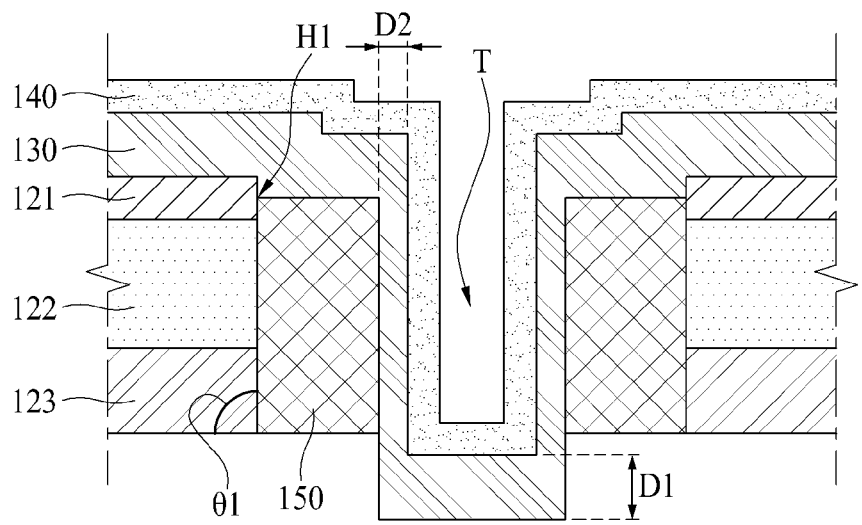
FIGS. 3A and 3B are enlarged views illustrating 'A' portion of FIG. 2.
Figure 3B:
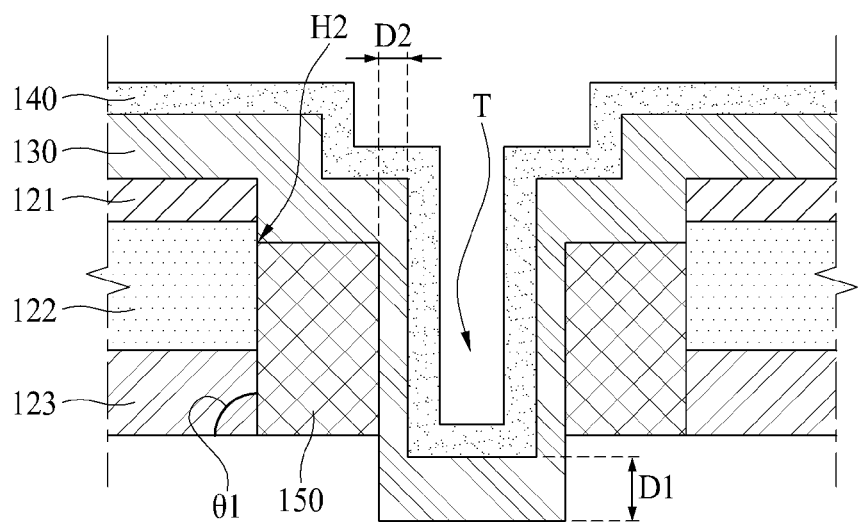

In the embodiment of the present disclosure, the planarization film 150 is provided to realize a flat surface by filling up the step-difference area between the second insulating film 117 (or first insulating film 113) and the first electrode 120 so that it is possible to prevent the first electrode 120 from being structurally disconnected with one or more of the second electrode 140 or the charge generation layer of the organic light emitting layer 130 in the step-difference area between the second insulating film 117 (or first insulating film 113) and the first electrode 120. Especially, in order to minimize a height difference between the second insulating film 117 and the transparent electrode 121, a height (H1) in the edge of the planarization film 150 is the same as or smaller than a height of the first electrode 120. This is one of the example implementation, which is not limiting the scope of the disclosure. The height (H1) in the edge of the planarization film 150 may be higher than the height of the first electrode 120. For example, as shown in FIG. 3A, a height (H1) in the edge of the planarization film 150 may be positioned at any point on a vertical plane of the first electrode 120. As shown in FIG. 3B, a height (H2) in the edge of the planarization film 150 may be lower than a height of the reflective electrode 122, and may be positioned at any point on a vertical plane of the reflective electrode 122.

As described above, the organic light emitting layer 130 has the bad step coverage. Thus, a thickness (D2) of the organic light emitting layer 130 at the sidewall of the sixth hole (T) prepared in the planarization film 150 may be smaller than a thickness (D1) of the organic light emitting layer 130 at the bottom of the sixth hole (T).

That is, if providing the sixth hole (T) with the hollow in the planarization film 150, a length of a current leakage path through the organic light emitting layer 130 in the area between the adjacent pixels (P) is relatively long in comparison to a case where the sixth hole (T) is not provided in the planarization film 150. Also, given that the thickness (D2) of the organic light emitting layer 130 at the sidewall of the sixth hole (T) is smaller than the thickness (D1) of the organic light emitting layer 130 at the bottom of the sixth hole (T), it is possible to increase a resistance of the organic light emitting layer 130, whereby it is possible to minimize an influence on the adjacent pixel by a leakage current through the organic light emitting layer 130.

The second electrode 140 is disposed on the organic light emitting layer 130. The second electrode 140 may be a common layer provided on the pixels (P) in common. The second electrode 140 may be formed of a transparent metal material (transparent conductive material, TCO) capable of transmitting light therethrough, for example, Indium Tin Oxide (ITO) or Indium Zinc Oxide (IZO), or may be formed of a semi-transmissive metal material (semi-transmissive conductive material), for example, magnesium (Mg), argentums (Ag), or alloy of magnesium (Mg) and argentums (Ag). If the second electrode 140 is formed of the semi-transmissive conductive material, it is possible to obtain a microcavity effect.

The second electrode 140 may be formed by a physical vapor deposition method such as a sputtering process. If a film is formed by the physical vapor deposition method such as the sputtering process, it has good step coverage. Accordingly, the second electrode 140 has a more uniform deposition thickness in comparison with the organic light emitting layer 130 even though there is the sixth hole (T).

The encapsulation film 160 is disposed on the second electrode 140. The encapsulation film 160 prevents a permeation of oxygen or moisture into the organic light emitting layer 130 and the second electrode 140. To this end, the encapsulation film 160 may include at least one inorganic film and at least one organic film.

Then, color filters 171 and 172 are disposed on the encapsulation film 160. Each of the color filters 171 and 172 is disposed for each pixel (P). For example, a red color filter may be disposed in a red pixel, a green color filter may be disposed in a green pixel, and a blue color filter may be disposed in a blue pixel.

An overcoat layer may be provided so as to planarize the step difference caused by the color filters 171 and 172. Then, an encapsulation film 160 may be attached onto the color filters 171 and 172.

Figure 4:
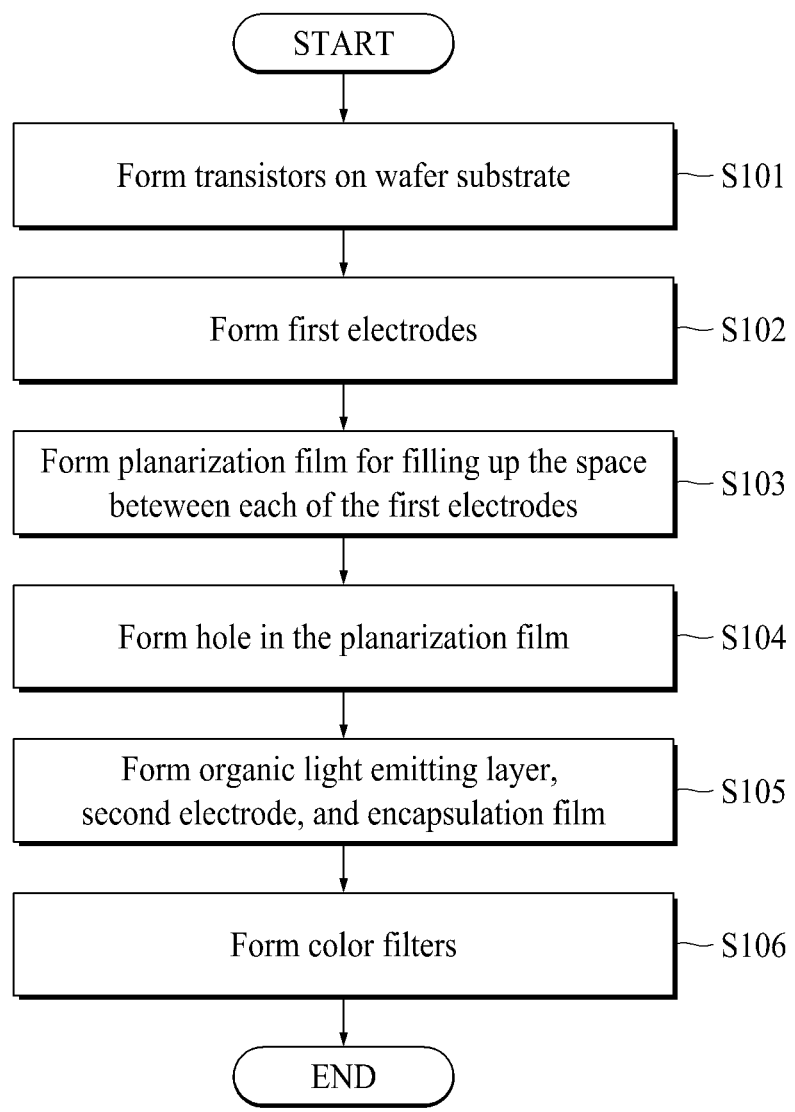
FIG. 4 is a flow chart illustrating a method for manufacturing the OLED device according to one embodiment of the present disclosure.

FIG. 4 is a flow chart illustrating a method for manufacturing the OLED device according to one embodiment of the present disclosure. FIGS. 5A to 5H are cross sectional views illustrating the method for manufacturing the OLED device according to one embodiment of the present disclosure.

Figure 5A:
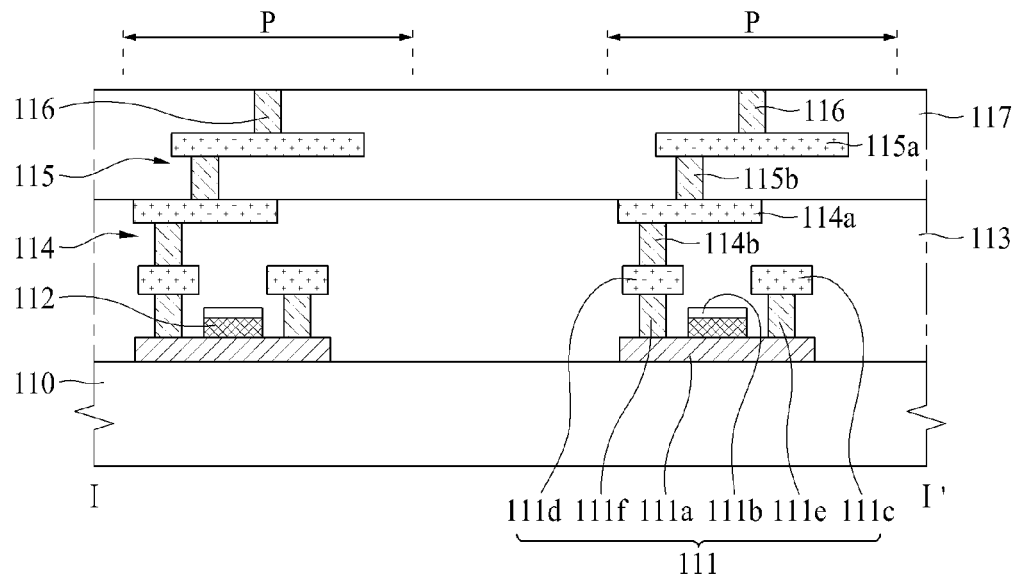
FIGS. 5A to 5H are cross sectional views illustrating the method for manufacturing the OLED device according to one embodiment of the present disclosure.

First, as shown in FIG. 5A, the transistors 111 are provided on the wafer substrate 110.

In detail, the active layer 111a for each of the transistors 111 is provided on the wafer substrate 110. The active layer 111a may be formed of a silicon-based semiconductor material or an oxide-based semiconductor material.

Then, the gate insulating film 112 is provided on the active layer 111a. The gate insulating film 112 may be formed of an inorganic film, for example, a silicon oxide film (SiOx), a silicon nitride film (SiNx), or a multi-layered film including silicon oxide (SiOx) and silicon nitride (SiNx), but not limited to those.

Thereafter, the gate electrode 111b is provided on the gate insulating film 112.

The first insulating film 113 is provided on the active layer 111a and the gate electrode 111b. The first insulating film 113 may be formed of an inorganic film, for example, a silicon oxide film (SiOx), a silicon nitride film (SiNx), or a multi-layered film including silicon oxide (SiOx) and silicon nitride (SiNx), but not limited to those.

Then, the first and second holes/vias 111e and 111f penetrating through the first insulating film 113 are connected with the active layer 111a. The source electrode 111c and the drain electrode 111d are provided on the first insulating film 113, wherein the source electrode 111c is connected with the active layer 111a via the first hole/via 111e, and the drain electrode 111d is connected with the active layer 111a via the second hole/via 111f.

Then, the first insulating film 113 is additionally provided on the source electrode 111c and the drain electrode 111d, and the third hole/via 114b penetrating through the additionally-provided first insulating film 113 is connected with the drain electrode 111d. Also, the M3 metal layer 114a, which is connected with the drain electrode 111d via the third hole/via 114b, is provided on the additionally-provided first insulating film 113.

Thereafter, the second insulating film 117 is provided on the M3 metal layer 114a. The second insulating film 117 may be formed of an inorganic film, for example, a silicon oxide film (SiOx), a silicon nitride film (SiNx), or a multi-layered film including silicon oxide (SiOx) and silicon nitride (SiNx).

Then, the fourth hole/via 115b penetrating through the second insulating film 117 is connected with the M3 metal layer 114a. The M4 metal layer 115a connected with the M3 metal layer 114a via the fourth hole/via 115b is provided on the second insulating film 117.

Thereafter, the second insulating film 117 is additionally provided on the M4 metal layer 115a. The fifth hole/via 116 penetrating through the additionally-provided second insulating film 117 is connected with the M4 metal layer 115a (S101 of FIG. 4).

Secondly, the first electrodes 120 are provided on the second insulating film 117.

Figure 5B:
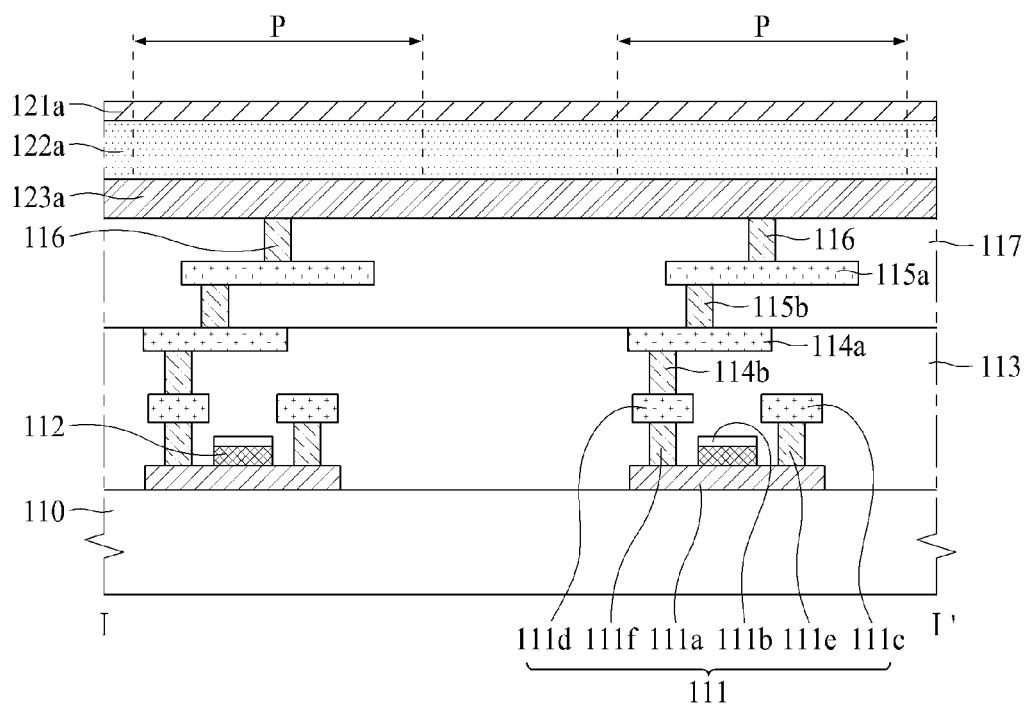

In detail, as shown in FIG. 5B, a buffer metal film 123a, a reflective metal film 122a, and a transparent electrode film 121a are provided on the second insulating film 117. The buffer metal film 123a may be formed in a double-layered structure of titanium (Ti) and titanium nitride (TiN). The reflective metal film 122a may be formed of a metal material with high reflectance, for example, argentums (Ag). The transparent electrode film 121a may be formed of a transparent metal material (transparent conductive material, TCO) capable of transmitting light therethrough, for example, Indium Tin Oxide (ITO) or Indium Zinc Oxide (IZO).

Figure 5C:
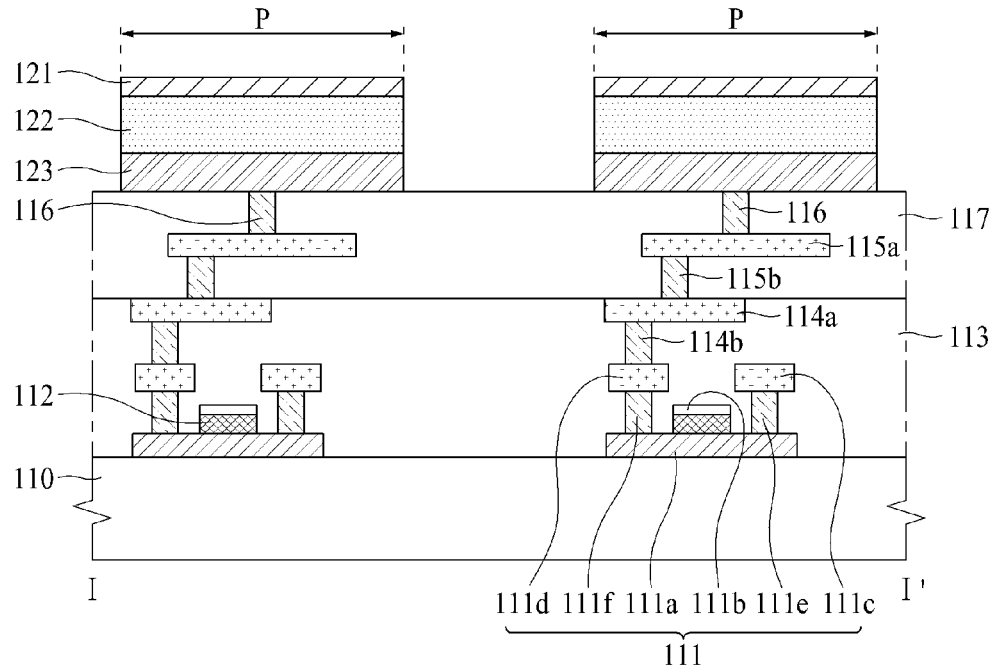

Then, a photoresist pattern is provided on the transparent electrode film 121a, the reflective metal film 122a, and the buffer metal film 123a. The photoresist pattern may be positioned in the area for the pixels (P). The transparent electrode film 121a, the reflective metal film 122a, and the buffer metal film 123a, which are not covered by the photoresist pattern, are dry-etched, as shown in FIG. 5C, thereby forming the transparent electrodes 121, the reflective electrodes 122, and the buffer electrodes 123, and removing the photoresist pattern (S102 of FIG. 4).

Thirdly, the planarization film 150 is provided between each of the first electrodes 120.

Figure 5D:
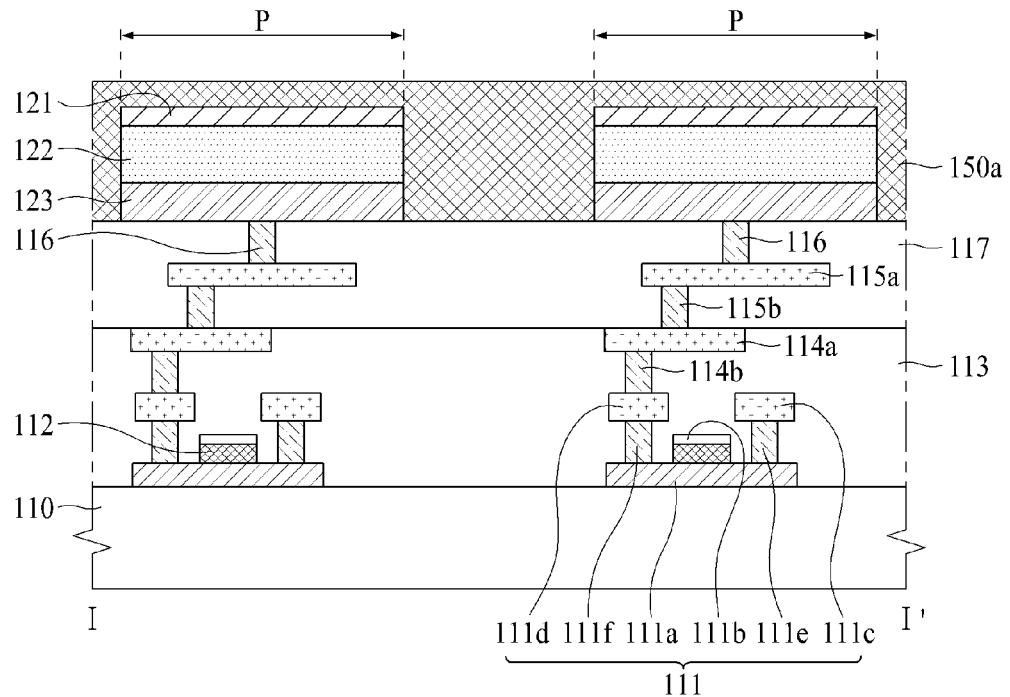

In detail, as shown in FIG. 5D, a filling material 150a is provided on the second insulating film 117 and the first electrodes 120. The filling material 150a may be an organic material, for example, acryl resin, epoxy resin, phenolic resin, polyamide resin, or polyimide resin.

Figure 5E:
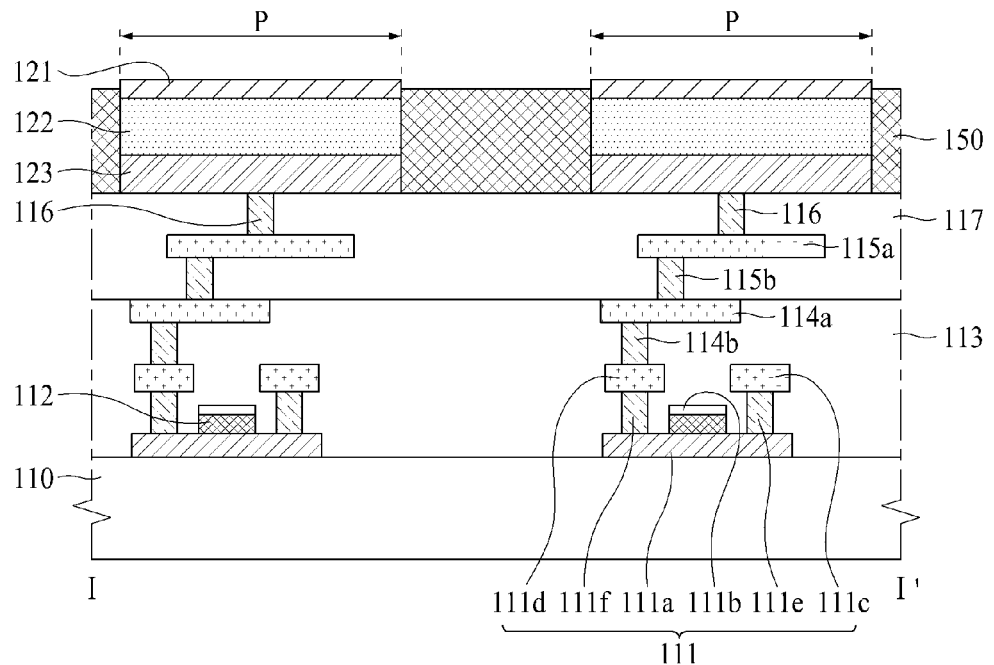

Then, the planarization film 150 is formed by a dry etching process, as shown in FIG. 5E. A dry etching material is selected from any one of materials which are capable of etching the filling material 150a and are not capable of etching the first electrodes 120, preferably.

If the planarization film 150 is formed by the dry etching process, the planarization film 150 may fill the space between the transparent electrodes 121. Especially, the planarization film 150 filled in the space between the transparent electrodes 121 may be provided with the hollow by the dry etching processes. That is, a height of the planarization film 150 filled in the space between the first electrodes 120 may be the same as or lower than a height of each of the transparent electrodes 121. For example, as shown in FIG. 3A, the height (H1) in the edge of the planarization film 150 may be positioned at any point on a vertical plane of the transparent electrode 121. As shown in FIG. 3B, the height (H2) in the edge of the planarization film 150 may be lower than a height of the reflective electrode 122, and may be positioned at any point on a vertical plane of the reflective electrode 122.

Also, the planarization film 150 is formed by the dry etching process without using a mask so that it is possible to reduce a manufacturing cost (S103 of FIG. 4).

Figure 5F:
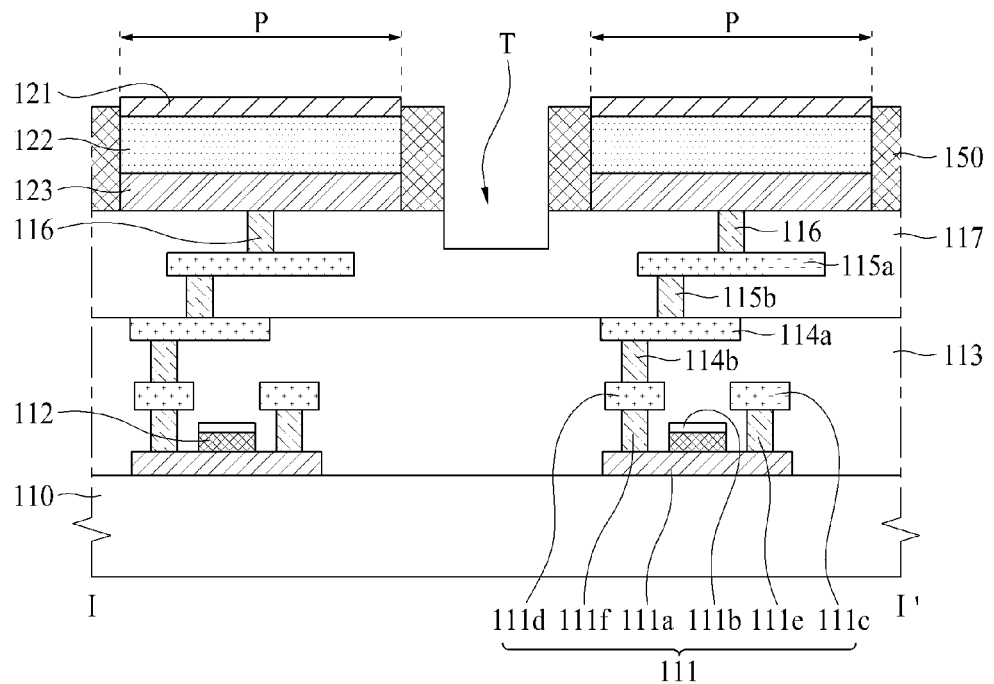

Fourthly, as shown in FIG. 5F, the sixth hole (T) is formed in the planarization film 150.

In detail, a photoresist pattern is provided in the remaining area except the area for the sixth hole (T). The sixth hole (T) is formed by etching the planarization film exposed without being covered by the photoresist pattern, and then the photoresist pattern is removed (S104 of FIG. 4).

Figure 5G:
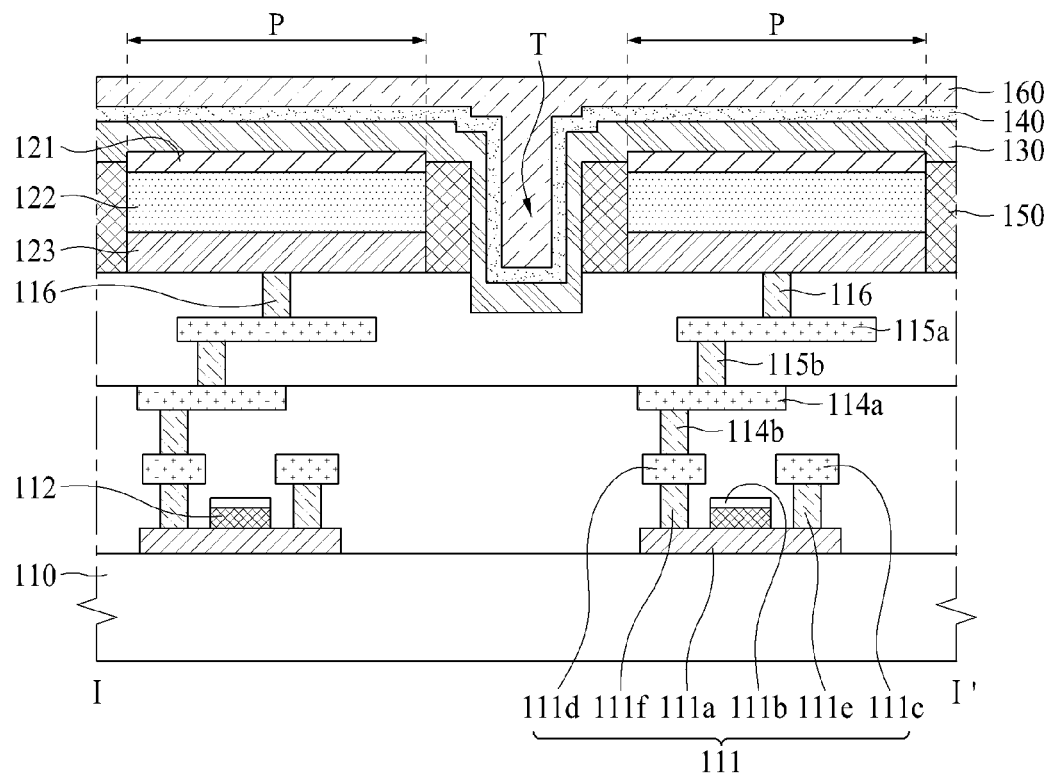

Fifthly, as shown in FIG. 5G, the organic light emitting layer 130, the second electrode 140, and the encapsulation film 160 are sequentially provided.

In detail, the organic light emitting layer 130 is provided on the transparent electrodes 121 and the planarization film 150. The organic light emitting layer 130 may be formed by the deposition process or the solution process. In case of the deposition process, the organic light emitting layer 130 may be formed by the evaporation process.

The organic light emitting layer 130 may be the white light emitting layer for emitting white light. In this case, the organic light emitting layer 130 may be a common layer provided on the pixels (P) in common.

If the organic light emitting layer 130 is the white light emitting layer, it may have the tandem structure of two stacks or more than two stacks. Each stack may include a hole transporting layer, at least one light emitting layer, and an electron transporting layer.

Between each of the stacks, there may be a charge generation layer. The charge generation layer may include an n-type charge generation layer positioned adjacent to the lower stack, and a p-type charge generation layer provided on the n-type charge generation layer and positioned adjacent to the upper stack. The n-type charge generation layer injects the electron into the lower stack, and the p-type charge generation layer injects the hole into the upper stack. The n-type charge generation layer may be formed of an organic layer doped with alkali metal such as lithium (Li), natrium (Na), kalium (K) or cesium (Cs), or alkali earth metal such as magnesium (Mg), strontium (Sr), barium (Ba) or radium (Ra). The P-type charge generation layer may be formed of an organic layer doped with dopant with a hole transporting capacity.

The organic light emitting layer 130 is manufactured by the evaporation process, whereby it has the bad step coverage. Thus, the thickness (D2) of the organic light emitting layer 130 at the sidewall of the sixth hole (T) may be smaller than the thickness (D1) of the organic light emitting layer 130 at the bottom of the sixth hole (T).

Thereafter, the second electrode 140 is provided on the organic light emitting layer 130. The second electrode 140 may be a common layer provided on light emitting areas (EA) in common. The second electrode 140 may be formed of a transparent metal material (transparent conductive material, TCO) capable of transmitting light therethrough, for example, Indium Tin Oxide (ITO) or Indium Zinc Oxide (IZO), or may be formed of a semi-transmissive metal material (semi-transmissive conductive material), for example, magnesium (Mg), argentums (Ag), or alloy of magnesium (Mg) and argentums (Ag). If the second electrode 140 is formed of the semi-transmissive conductive material, it is possible to obtain a micro-cavity effect.

The second electrode 140 may be formed by a physical vapor deposition method such as a sputtering process. If a film is formed by the physical vapor deposition method such as the sputtering process, it has good step coverage. Accordingly, the second electrode 140 has a more uniform deposition thickness in comparison with the organic light emitting layer 130 even though there is the sixth hole (T).

The encapsulation film 160 is disposed on the second electrode 140. The encapsulation film 160 prevents a permeation of oxygen or moisture into the organic light emitting layer 130 and the second electrode 140. To this end, the encapsulation film 160 may include at least one inorganic film and at least one organic film (S105 of FIG. 4).

Figure 5H:
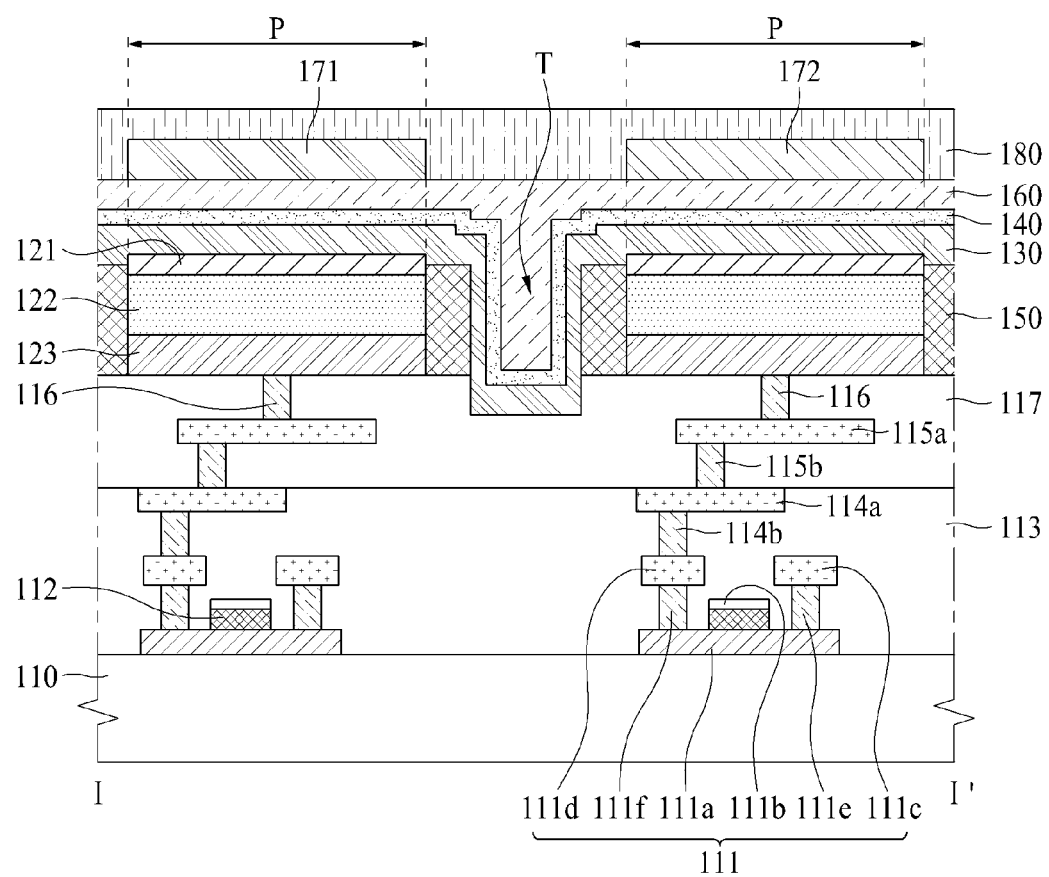

Sixthly, with reference to FIG. 5H, the color filters 171 and 172 are disposed on the encapsulation film 160. Each of the color filters 171 and 172 is disposed for each pixel (P). For example, a red color filter may be disposed in a red pixel, a green color filter may be disposed in a green pixel, and a blue color filter may be disposed in a blue pixel. Other color patterns are also possible for the pixels. Then, the overcoat layer 180 may be provided so as to planarize the step difference caused by the color filters 171 and 172 (S106 of FIG. 4).

Figure 6:
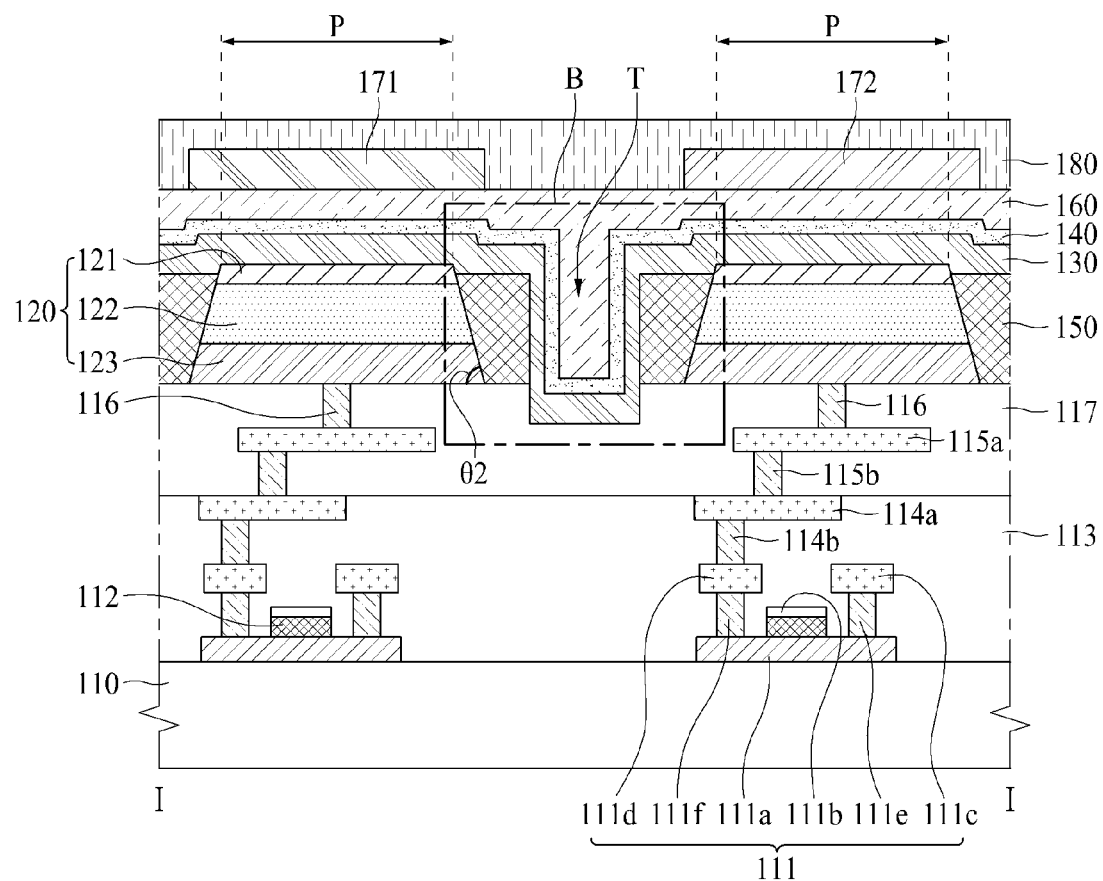
FIG. 6 is a cross-sectional view of another example along I-I' of FIG. 1.

FIG. 6 is a cross sectional view of another example along I-I' of FIG. 1.

Except that the transparent electrodes 121, the reflective electrodes 122, and the buffer electrodes 123 are formed in a forward-tapered structure, the example OLED device of FIG. 6 is identical or very similar to the example OLED device of FIG. 2, whereby a detailed description for the OLED device of FIG. 6 will be omitted. In case of the forward-tapered structure, an inner angle ($\theta 2$) between the second insulating film 117 (or first insulating film 113) and a lateral surface of each of the transparent electrodes 121, the reflective electrodes 122, and the buffer electrodes 123 is between 0° and 90°. The forward-tapered structure of the first electrode 120 including the transparent electrodes 121, the reflective electrodes 122, and the buffer electrodes 123 may help to improve the edge effect of the pixel area.

Figure 7A:
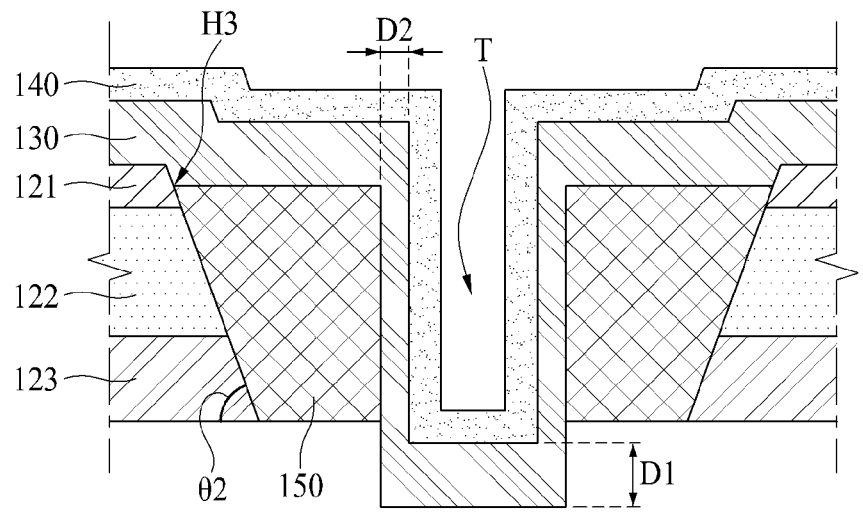
FIGS. 7A and 7B are enlarged views illustrating 'B' portion of FIG. 6.
Figure 7B:
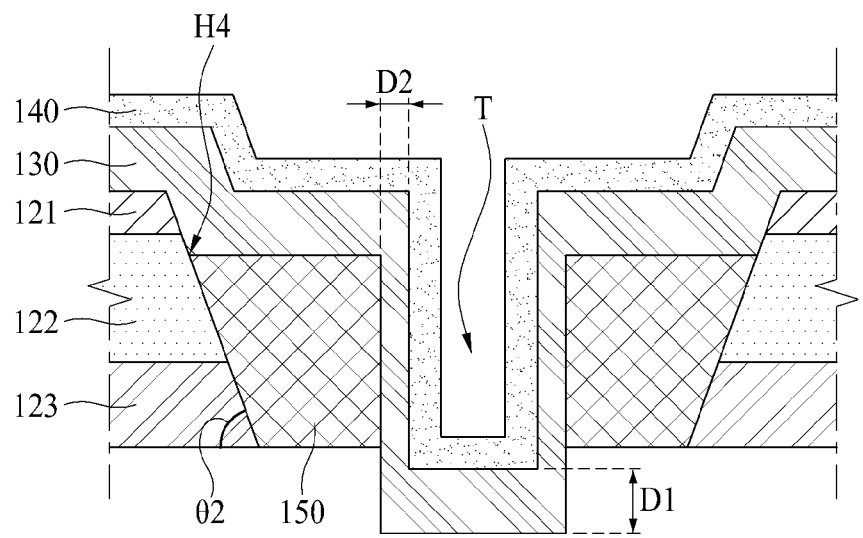

In the space between the transparent electrodes 121, the planarization film 150 is provided to fill up the step-difference area between the second insulating film 117 (or the first insulating film 113) and the first electrode 120 so that it is possible to prevent the first electrode 120 from being structurally disconnected with the second electrode 140 or the charge generation layer of the organic light emitting layer 130 in the step-difference area between the second insulating film 117 and the transparent electrode 121. Especially, in order to minimize a height difference between the second insulating film 117 and the transparent electrode 121, a height (H3) in the edge of the planarization film 150 may be positioned at any point on a vertical plane of the transparent electrode 121, as shown in FIG. 7A, or a height (H4) in the edge of the planarization film 150 may be lower than a height of the reflective electrode 122 and positioned at any point on a vertical plane of the reflective electrode 122, as shown in FIG. 7B.

Except for a process S102 of forming the transparent electrodes 121, the reflective electrodes 122, and the buffer electrodes 123 in the forward-tapered structure, the method for manufacturing the OLED device shown in FIG. 6 is identical to the method for manufacturing the OLED device shown in FIG. 4. Accordingly, a detailed description for the method for manufacturing the OLED device shown in FIG. 6 will be omitted.

Meanwhile, for example, a high-frequency inductively coupled plasma device may spray gas into the inside of a chamber through a gas supplying means, may apply a first RF power to a power supplier positioned at an upper side, and may apply a second RF power to a power supplier positioned at a lower part of a substrate, whereby the transparent electrodes 121, the reflective electrodes 122, and the buffer electrodes 123 are anisotropically etched by an ion bombardment. That is, the high-frequency inductively coupled plasma device may individually adjust an ion energy applied to the transparent electrodes 121, the reflective electrodes 122, and the buffer electrodes 123. Accordingly, it is possible to realize the vertical structure or forward-tapered structure in the transparent electrodes 121, the reflective electrodes 122, and the buffer electrodes 123 by the anisotropic etching process using the high-frequency inductively coupled plasma device.

Figure 8:
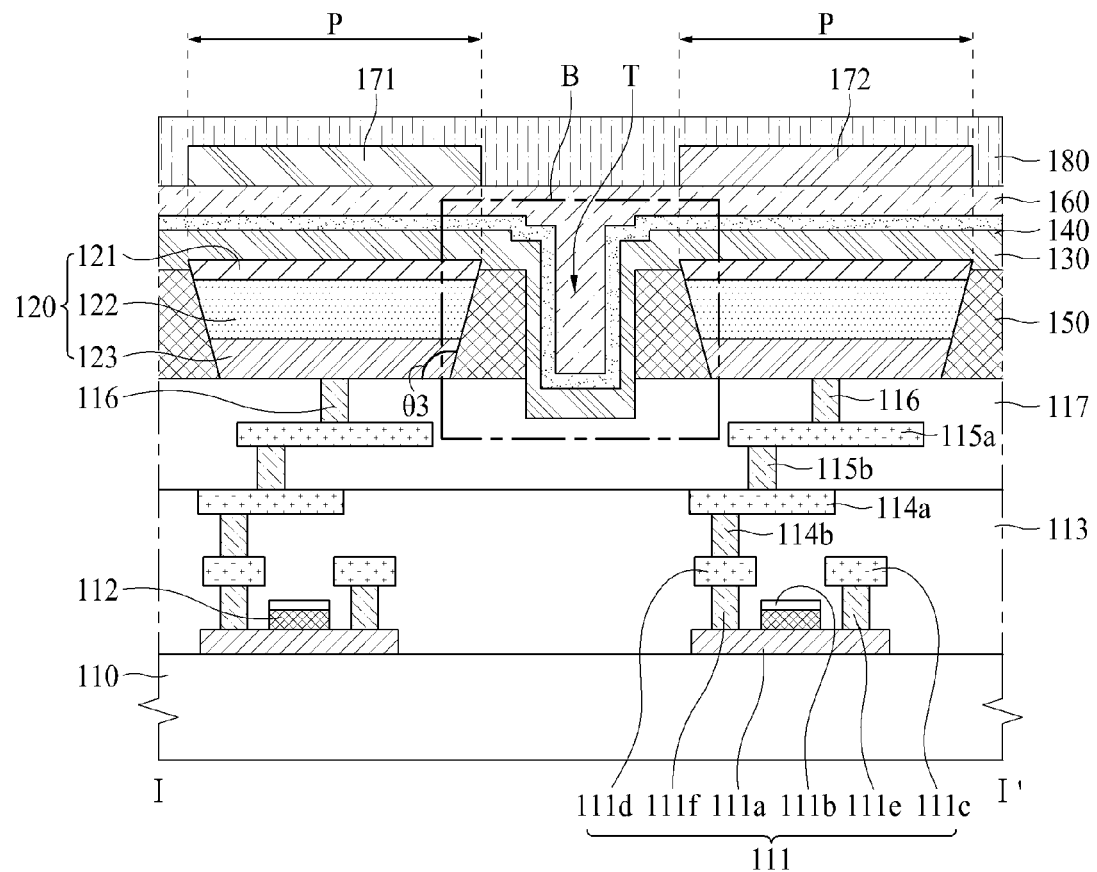
FIG. 8 is a cross-sectional view of another example along I-I' of FIG. 1.

FIG. 8 is a cross sectional view of another example along I-I' of FIG. 1.

Except that the transparent electrodes 121, the reflective electrodes 122, and the buffer electrodes 123 are formed in a reverse-tapered structure, the example OLED device of FIG. 8 is identical to the example OLED device of FIG. 2, whereby a detailed description for the OLED device of FIG. 8 will be omitted. In case of the reverse-tapered structure, an inner angle ($\theta 3$) between the second insulating film 117 (or the first insulating film 113) and a lateral surface of each of the transparent electrodes 121, the reflective electrodes 122, and the buffer electrodes 123 is between 90° and 180°.

In the space between the first electrodes 120, the planarization film 150 is provided to fill up the step-difference area between the second insulating film 117 and the first electrode 120 so that it is possible to prevent the first electrode 120 from being structurally disconnected with the second electrode 140 or the charge generation layer of the organic light emitting layer 130 in the step-difference area between the second insulating film 117 and the transparent electrode 121.

Figure 9:
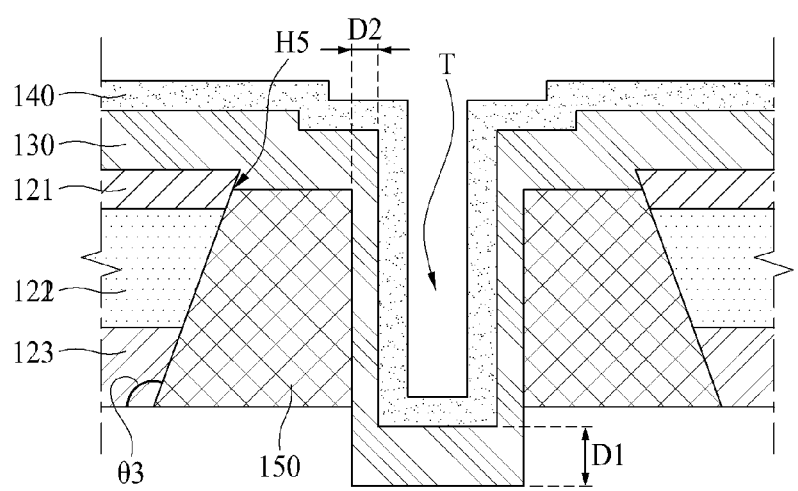
FIG. 9 is an enlarged view illustrating 'C' portion of FIG. 8.

The transparent electrodes 121, the reflective electrodes 122, and the buffer electrodes 123 are formed in the reverse-tapered structure. If a height (H5) in the edge of the planarization film 150 is smaller than a height of the transparent electrode 121, a thickness of the organic light emitting layer 130 may be relatively thin at lateral sides of the transparent electrode 121 and the reflective electrode 122 due to its bad step coverage. In this case, the transparent electrode 121 or the reflective electrode 122 may be structurally disconnected from the charge generation layer of the organic light emitting layer 130 or the second electrode 140. Accordingly, in order to minimize a difference in height between the second insulating film 117 and the transparent electrode 121, as shown in FIG. 9, the height (H5) in the edge of the planarization film 150 may be positioned at any point on a vertical plane of the transparent electrode 121. And more preferably, the height (H5) in the edge of the planarization film 150 may be substantially the same as a height of the transparent electrode 121.

Except for a process S102 of forming the transparent electrodes 121, the reflective electrodes 122, and the buffer electrodes 123 in the reverse-tapered structure by a wet-etching method, the method for manufacturing the OLED device shown in FIG. 8 is identical to the method for manufacturing the OLED device shown in FIG. 4. Herein, the wet-etching method uses a liquid type etchant so that it is possible to etch the transparent electrodes 121, the reflective electrodes 122, and the buffer electrodes 123 in the reverse-tapered structure. Further description for the method for manufacturing the OLED device shown in FIG. 8 will be omitted for simplicity.

Figure 10:
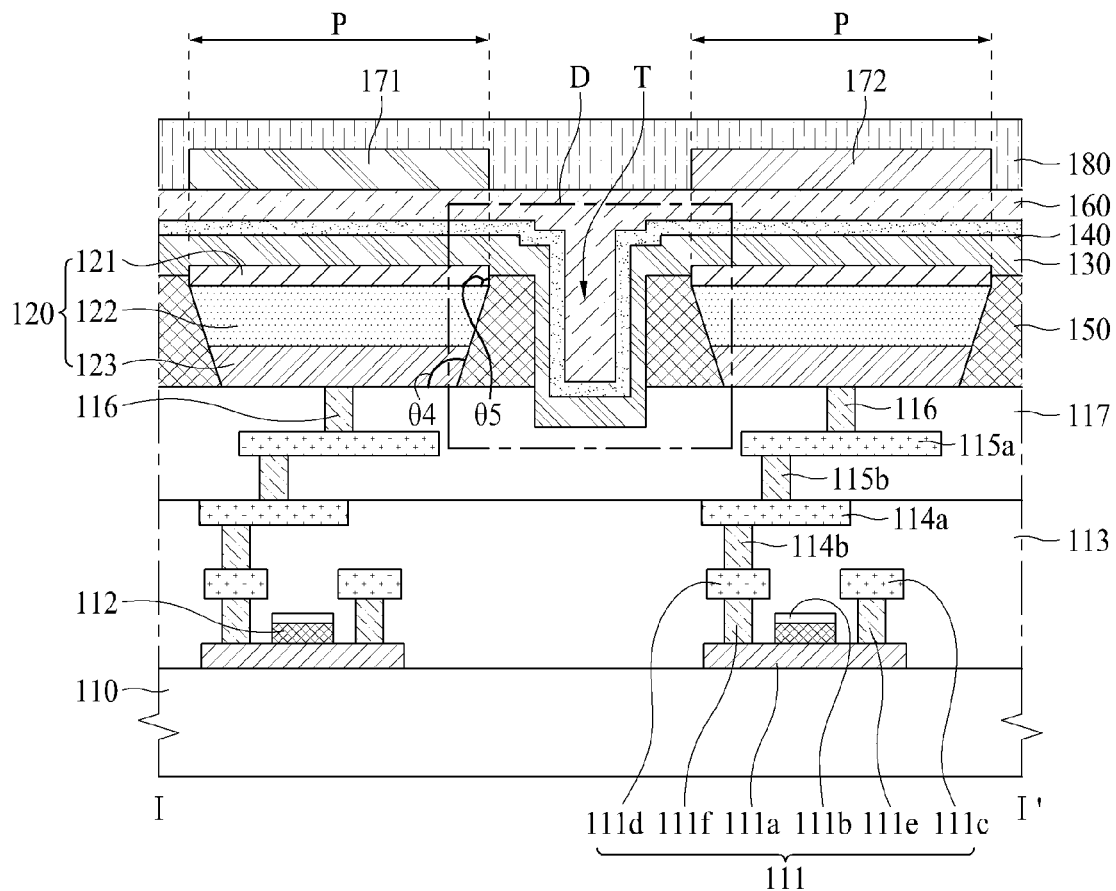
FIG. 10 is a cross sectional view of another example along I-I' of FIG. 1.

FIG. 10 is a cross sectional view of another example along I-I' of FIG. 1.

Figure 11:
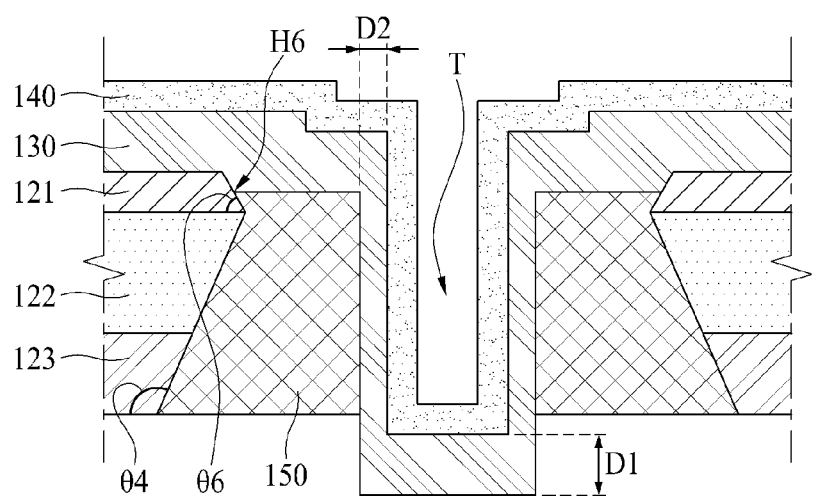
FIG. 11 is an enlarged view illustrating 'D' portion of FIG. 10.

Except that the transparent electrodes 121 are formed in a vertical structure or forward-tapered structure, and the reflective electrodes 122 and the buffer electrodes 123 are formed in a reverse-tapered structure, the OLED device of FIG. 10 is identical to the OLED device of FIG. 2, whereby a detailed description for the OLED device of FIG. 10 will be omitted. The reverse-tapered structure indicates that an inner angle ($\theta 4$) between the second insulating film 117 (or the first insulating film 113) and a lateral surface of each of the reflective electrodes 122 and the buffer electrodes 123 is between 90° and 180°. The vertical structure indicates that an inner angle ($\theta 5$) between the reflective electrode 122 and a lateral surface of the transparent electrodes 121 is 90° or substantially 90°. The forward-tapered structure indicates that an inner angle ($\theta 6$) (FIG. 11) between the reflective electrode 122 and a lateral surface of the transparent electrodes 121 is between 0° and 90°.

In the space between the first electrodes 120, the planarization film 150 is provided to fill up the step-difference area between the second insulating film 117 and the first electrode 120 so that it is possible to prevent the first electrode 120 from being structurally disconnected with the second electrode 140 or the charge generation layer of the organic light emitting layer 130 in the step-difference area between the second insulating film 117 and the first electrode 120.

The reflective electrodes 122 and the buffer electrodes 123 are formed in the reverse-tapered structure. If a height (H6) in the edge of the planarization film 150 is smaller than a height of the transparent electrode 121, a thickness of the organic light emitting layer 130 may be relatively thin at a lateral side of the reflective electrode 122 due to its bad step coverage. In this case, the reflective electrode 122 may be disconnected with the second electrode 140 or the charge generation layer of the organic light emitting layer 130. Accordingly, in order to minimize a difference in height between the second insulating film 117 and the first electrode 120, as shown in FIG. 10, the height (H6) in the edge of the planarization film 150 may be positioned at any point on a vertical plane of the transparent electrode 121.

Except for a step S102, the method for manufacturing the OLED device shown in FIG. 10 is identical or very similar to the method for manufacturing the OLED device shown in FIG. 4. Accordingly, a detailed description for steps S101, and S103 to S106 in the method for manufacturing the OLED device shown in FIG. 10 will be omitted.

Figure 12A:
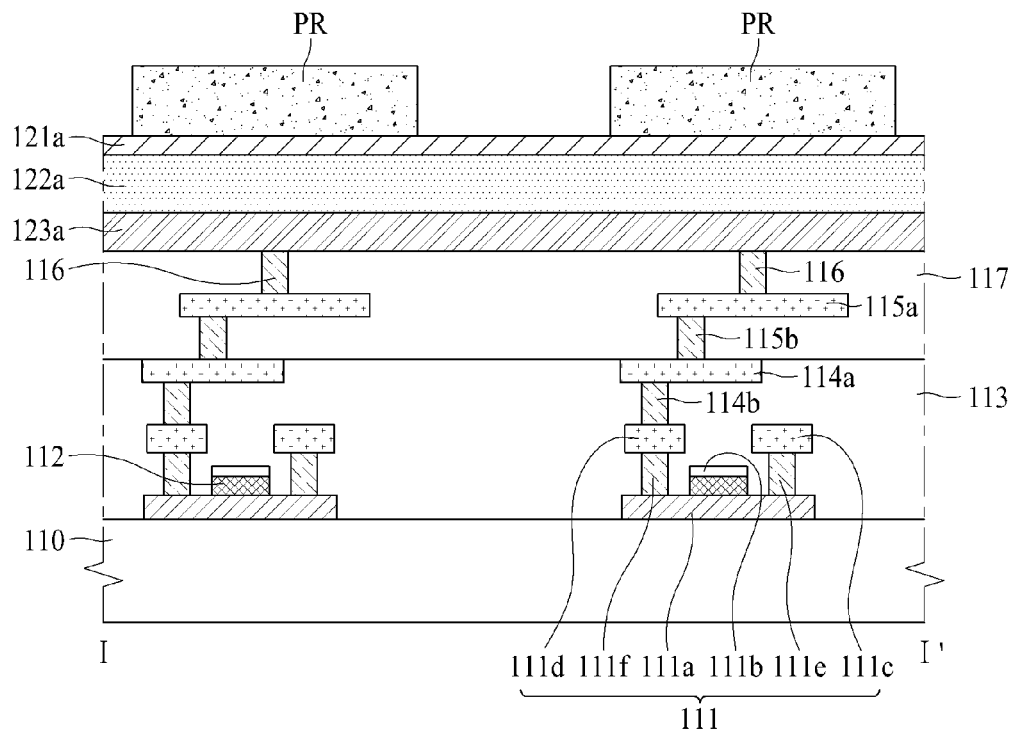
FIGS. 12A to 12C are cross sectional views illustrating a method for manufacturing the OLED device according to another embodiment of the present disclosure.
Figure 12B:
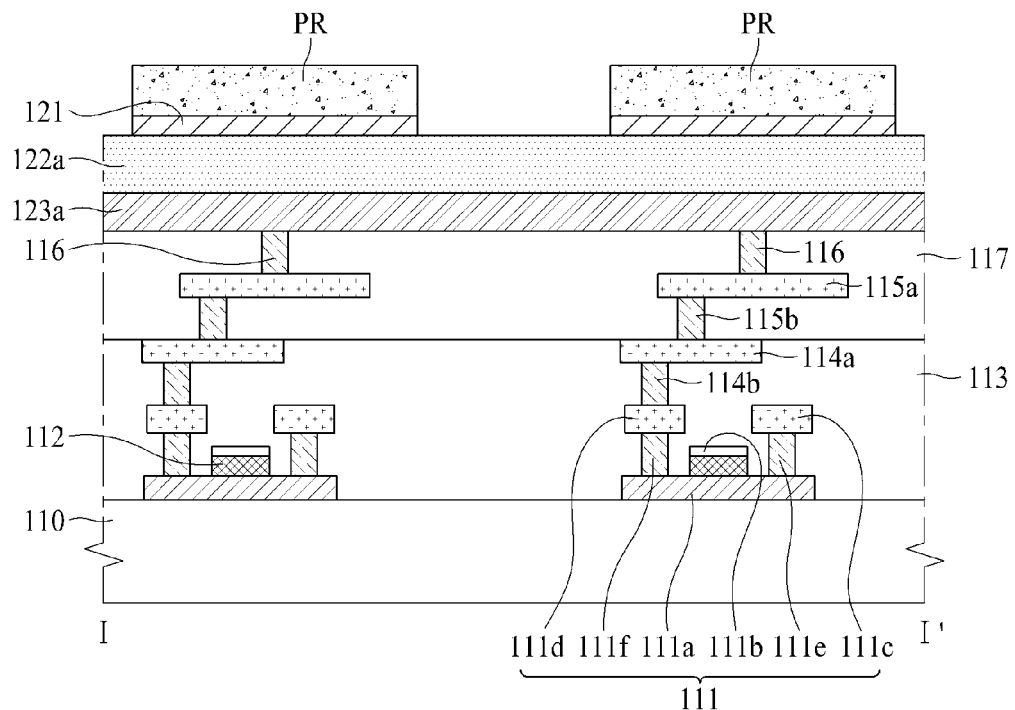
Figure 12C:
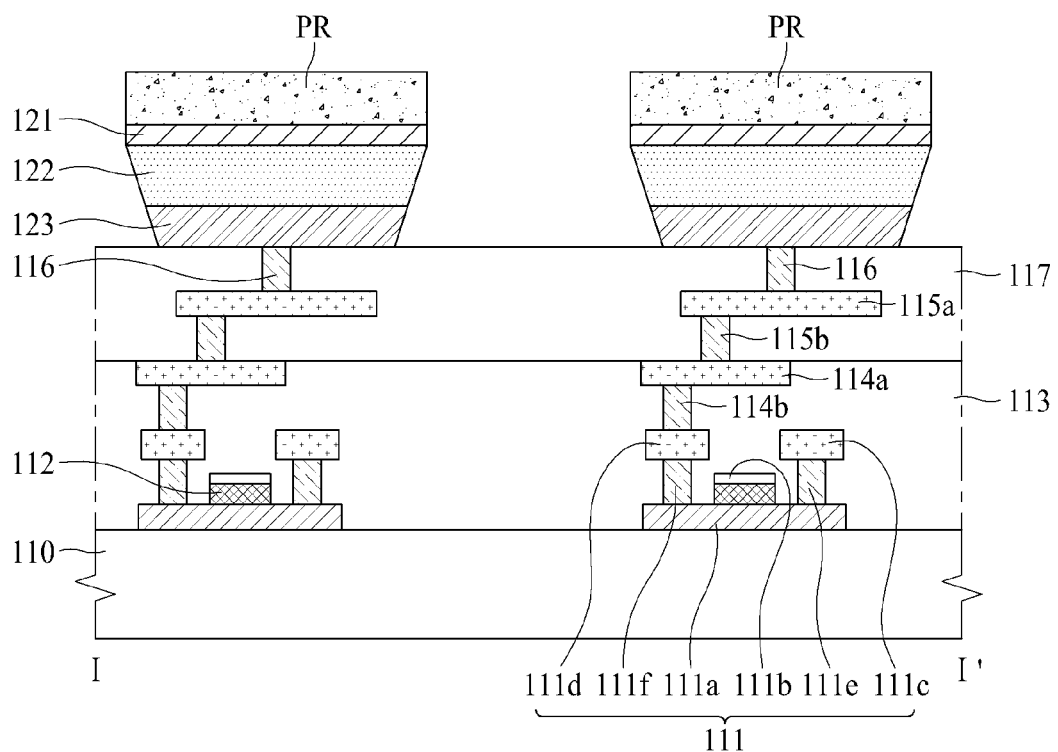

FIGS. 12 to 12C are cross sectional views illustrating a method for manufacturing the OLED device according to another embodiment of the present disclosure. Hereinafter, the method for manufacturing the OLED device shown in FIG. 10 will be described in detail with reference to FIGS. 12 to 12C.

First, a buffer metal film 123a, a reflective metal film 122a, and a transparent electrode film 121a are provided sequentially. The buffer electrode 123 may be formed in a double-layered structure of titanium (Ti) and titanium nitride (TiN). The reflective metal film 122a may be formed of a metal material with high reflectance, for example, argentums (Ag). The transparent electrode film 121a may be formed of a transparent metal material (transparent conductive material, TCO) capable of transmitting light therethrough, for example, Indium Tin Oxide (ITO) or Indium Zinc Oxide (IZO).

Then, a photoresist pattern (PR) is provided on the transparent electrode film 121a, as shown in FIG. 12A. The photoresist pattern (PR) may be positioned in the area for the pixels (P).

Thereafter, as shown in FIG. 12B, the transparent electrode film 121a which is not covered by the photoresist pattern (PR) is dry-etched, to thereby form the transparent electrodes 121 in the vertical structure or forward-tapered structure (shown in FIG. 12B as vertical structure).

As shown in FIG. 12C, the reflective metal film 122a and the buffer metal film 123a are wet-etched, thereby forming the reflective electrode 122 and the buffer electrode 123 in the reverse-tapered structure, and the photoresist pattern (PR) is removed. The wet etching process uses a liquid type etchant so that the etchant may permeate into the area below the photoresist pattern (PR) and the transparent electrode 121 and the reflective electrode 122 and the buffer electrode 123 may be etched by the etchant. Accordingly, as shown in FIG. 12C, the reflective electrode 122 and the buffer electrode 123 may be etched in the reverse-tapered structure.

It should be appreciated that the example structures of the transparent electrodes 121, the reflective electrode 122, and/or the buffer electrodes 123 as illustrated in FIGS. 2, 6, 8 and 10 are all examples and none limits the scope of the disclosure. Each of the transparent electrodes 121, the reflective electrode 122, and/or the buffer electrodes 123 may be formed in (same or different) one of a vertical structure, a forward-tapered structure or a reverse-tapered structure and various combinations of the structures among the transparent electrodes 121, the reflective electrode 122, and/or the buffer electrodes 123 are all possible, which are all included in the disclosure. For example, it is possible that the transparent electrodes 121 is formed with a vertical structure and the reflective electrode 122, and/or the buffer electrodes 123 are formed with a forward-tapered structure.

Figure 13A:
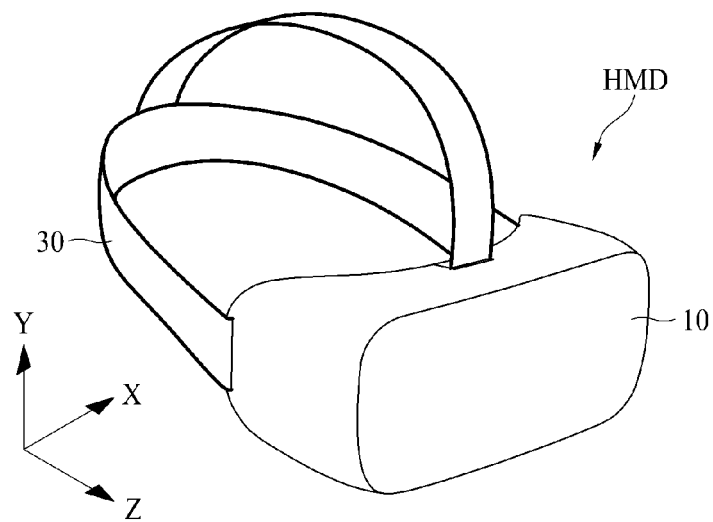
FIGS. 13A and 13B illustrate a head mounted display including the OLED device according to the embodiment of the present disclosure.
Figure 13B:
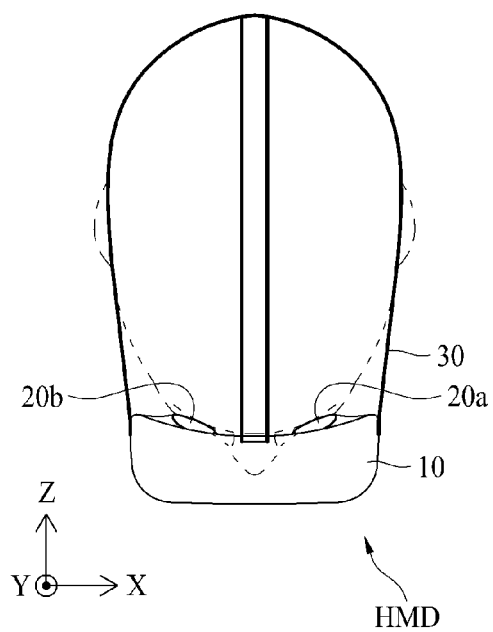

FIG. 13A and FIG. 13B illustrates examples of head mounted display including the OLED device according to the embodiment of the present disclosure.

Referring to FIG. 13A and FIG. 13B, the head mounted display including the OLED device according to the embodiment of the present disclosure may include a display receiving case 10, left-eye lens 20a and right-eye lens 20b, and a head-mounting element(s), e.g., a band element(s), 30.

The display receiving case 10 receives a display device therein, and provides an image of the display device to the left-eye lens 20a and the right-eye lens 20b. The display device may be the OLED device according to the embodiment of the present disclosure. The OLED device according to the embodiment of the present disclosure has been described in detail with reference to FIGS. 1 to 12.

The display receiving case 10 may be designed to provide the same image to the left-eye lens 20a and the right-eye lens 20b. In another aspect, the display receiving case 10 may be designed to display a left-eye image on the left-eye lens 20a, and to display a different right-eye image on the right-eye lens 20b.

Figure 14:
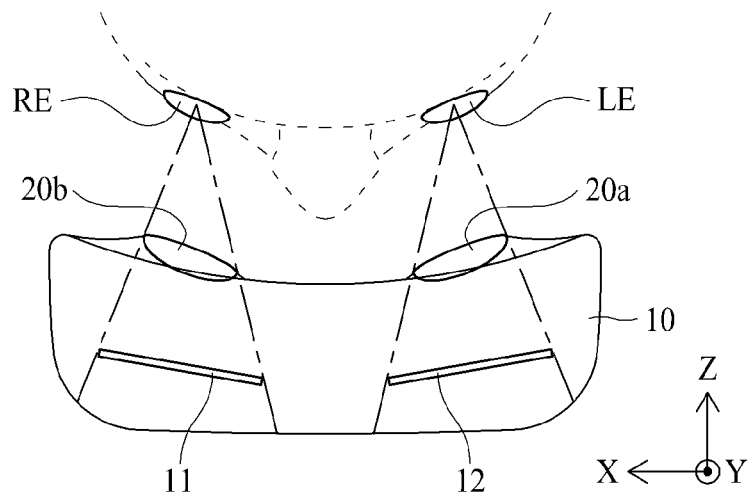
FIG. 14 illustrates one example of a display receiving case of FIGS. 13A and 13B.

As shown in FIG. 14, a left-side OLED device 11 arranged in front of the left-eye lens 20a and a right-side OLED device 12 arranged in front of the right-eye lens 20b may be received in the display receiving case 10. The structure of FIG. 14 may be applied to a virtual reality device and/or an augmented reality device.

FIG. 14 shows a conceptual cross sectional view of the display receiving case 10 as seen from above. The left-side OLED device 11 may display the left-eye image, and the right-side OLED device 12 may display the right-eye image. Thus, the left-eye image displayed on the left-side OLED device 11 may be seen by a user's left eye (LE) through the left-eye lens 20a, and the right-eye image displayed on the right-side OLED device 12 may be seen by a user's right eye (RE) through the right-eye lens 20b.

In FIG. 14, a magnifying lens may be additionally provided between the left-eye lens 20a and the left-side OLED device 11 and between the right-eye lens 20b and the right-side OLED device 12. In this case, the image displayed on the left-side OLED device 11 and the image displayed on the right-side OLED device 12 may be magnified and then seen by the user's eyes through the use of magnifying lens.

Figure 15:
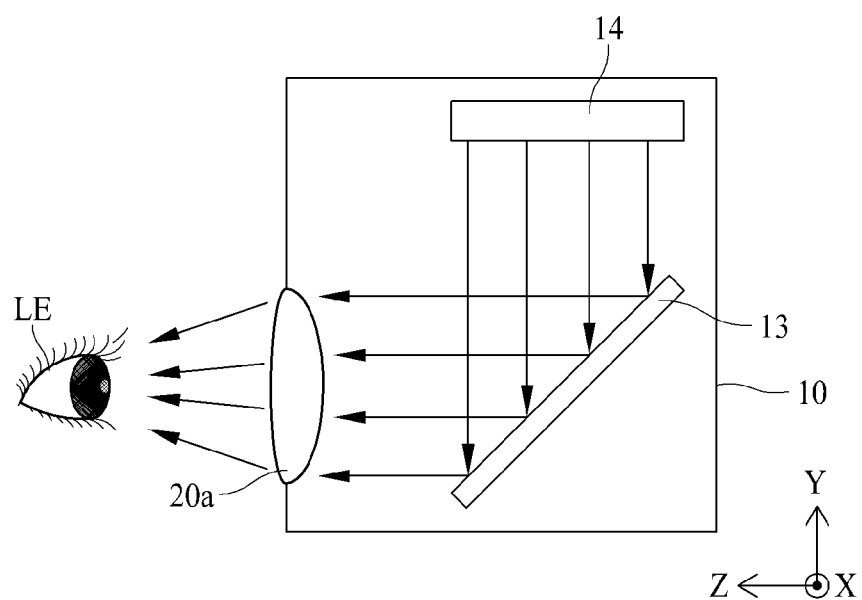
FIG. 15 illustrates another example of a display receiving case of FIGS. 13A and 13B.

As shown in FIG. 15, a half mirror 13 disposed in front of the left-eye lens 20a and the right-eye lens 20b and an organic light emitting display device 14 disposed on the half mirror 13 may be included in the display receiving case 10. The structure of FIG. 15 may be applied to an augmented reality device and/or a virtual reality device.

FIG. 15 is a conceptual cross sectional view of the display receiving case 10 as seen from the side. The organic light emitting display device 14 displays the image in a direction of a mirror reflector 13, and the mirror reflector 13 totally (or partially) reflects the image of the organic light emitting display device 14 to the left-eye lens 20a and the right-eye lens 20b. The image displayed on the organic light emitting display device 14 may be provided to the left-eye lens 20a and the right-eye lens 20b. For convenience of explanation, FIG. 15 shows only the left-eye lens 20a and the user's left eye (LE). If using the mirror reflector 13, as shown in FIG. 15, the display receiving case 10 is formed thinly. As described herein, mirror reflector 13 may be a half mirror to achieve beam splitting for augmented reality purposes.

In FIG. 15, a magnifying lens may be additionally provided between the left-eye lens 20a and the half mirror 13 and between the right-eye lens 20b and the half mirror 13. In this case, the image displayed on the left-side OLED device 11 and the image displayed on the right-side OLED device 12 may be magnified and then seen by the user's eyes through the use of magnifying lens.

The head-mounting band 30 is fixed to the display receiving case 10. For example, there is the head-mounting band 30 surrounding the top and side parts of the head, but not limited to this type. The head-mounting band 30 is provided to fix the head mounted display to a user's head. That is, the head-mounting band 30 may be formed in type of glasses or helmet.

According to the present disclosure, the planarization film 150 is provided to fill up the step-difference area between the second insulating film 117 (or the first insulating film 113) and the first electrode 120 so that it is possible to prevent the first electrode 120 from being structurally disconnected with the second electrode 140 or the charge generation layer of the organic light emitting layer 130 in the step-difference area between the second insulating film 117 and the first electrode 120.

According to the present disclosure, as the hole (T) with the hollow is provided in the planarization film 150, the length of the current leakage path through the organic light emitting layer 130 in the area between the adjacent pixels (P) is relatively long in comparison to the case where the hole (T) is not provided in the planarization film 150. Also, according to the present disclosure, as the thickness (D2) of the organic light emitting layer 130 at the sidewall of the hole (T) is smaller than the thickness (D1) of the organic light emitting layer 130 at the bottom of the hole (T), it is possible to increase a resistance of the organic light emitting layer 130, whereby it is possible to minimize an influence on the adjacent pixel by a leakage current through the organic light emitting layer 130.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. An organic light emitting display (OLED) device comprising:
    an insulating film;
    a first pixel area and a second pixel area on the insulating film, the first pixel area and the second pixel area each including a first electrode;
    a film filling a space laterally between the first electrode of the first pixel area and the first electrode of the second pixel area;
    a trench in the film between the first electrode of the first pixel area and the first electrode of the second pixel area, wherein the trench extends at least partially into the insulating film;
    an organic light emitting layer on the first electrodes of the first pixel area and the second pixel area and the film; and
    a second electrode on the organic light emitting layer.

2. The organic light emitting display (OLED) device according to claim 1, wherein a height in an edge of the film is substantially equal to or lower than a height of at least one of the first electrodes.

3. The organic light emitting display (OLED) device according to claim 1, wherein a height in an edge of the film is higher than a height of at least one of the first electrodes.

4. The organic light emitting display (OLED) device according to claim 1, wherein each of the first electrodes includes a reflective electrode and a transparent electrode on the reflective electrode.

5. The organic light emitting display (OLED) device according to claim 4, wherein the transparent electrode and the reflective electrode are each formed in one of a vertical structure, a reverse-tapered structure or a forward-tapered structure.

6. The organic light emitting display (OLED) device according to claim 4, wherein a height in an edge of the film is lower than a height of the transparent electrode and higher than a height of the reflective electrode.

7. The organic light emitting display (OLED) device according to claim 5, wherein the transparent electrode and the reflective electrode are each formed in a reverse-tapered structure.

8. The organic light emitting display (OLED) device according to claim 5, wherein the transparent electrode and the reflective electrode are each formed in a forward-tapered structure.

9. The organic light emitting display (OLED) device according to claim 5, wherein the reflective electrode is formed in a reverse-tapered structure, and the transparent electrode is formed in one of a vertical structure or a forward-tapered structure.

10. The organic light emitting display (OLED) device according to claim 1, wherein the organic light emitting layer is disposed on the trench, a thickness of the organic light emitting layer at a sidewall of the trench being smaller than a thickness of the organic light emitting layer at a bottom of the trench.

11. The organic light emitting display (OLED) device according to claim 4, wherein each of the first electrodes further includes a buffer electrode below the reflective electrode.

12. The organic light emitting display (OLED) device according to claim 3, wherein the transparent electrode and the reflective electrode are both formed in a vertical structure.

13. A head mounted display, comprising:
    an organic light emitting display (OLED) device, the OLED device including:
        an insulating film,
        a first pixel area and a second pixel area on the insulating film, the first pixel area and the second pixel area each including a first electrode,
        a film filling a space between the first electrode of the first pixel area and the first electrode of the second pixel area,
        an organic light emitting layer on the first electrodes of the first pixel area and the second pixel area and the film, and
        a second electrode on the organic light emitting layer;
    a display receiving case receiving the OLED device therein; and
    a lens disposed at one side of the display receiving case, and configured to be provided with an image of the OLED device.

14. The head mounted display according to claim 13, further comprising a hole in the film and between the first electrode of the first pixel area and the first electrode of the second pixel area.

15. The head mounted display according to claim 13, wherein a height in an edge of the film is substantially equal to or lower than a height of at least one of the first electrodes.

* * * * *